(12) United States Patent
Cho et al.

(10) Patent No.: US 11,490,489 B2
(45) Date of Patent: Nov. 1, 2022

(54) ELECTRONIC DEVICE FOR CONTROLLING LIGHT EMITTING ELEMENTS OF OPTICAL SENSOR MODULE BASED ON DISPLAY SIGNAL LINE VOLTAGE AND OPERATING METHOD OF ELECTRONIC DEVICE

(71) Applicant: SAMSUNG ELECTRONICS CO., LTD., Suwon-si (KR)

(72) Inventors: Jeongho Cho, Suwon-si (KR); Jongah Kim, Suwon-si (KR); Heewoong Yoon, Suwon-si (KR); Kihyuk Lee, Suwon-si (KR); Donghan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 36 days.

(21) Appl. No.: 17/106,640

(22) Filed: Nov. 30, 2020

(65) Prior Publication Data

US 2021/0185785 A1 Jun. 17, 2021

(30) Foreign Application Priority Data

Dec. 12, 2019 (KR) .................. 10-2019-0166099

(51) Int. Cl.
*H05B 47/10* (2020.01)
*H05B 47/11* (2020.01)
(Continued)

(52) U.S. Cl.
CPC ............ *H05B 47/11* (2020.01); *G01J 3/2803* (2013.01); *G01S 17/89* (2013.01); *H01L 25/167* (2013.01); *H04N 5/2257* (2013.01); *H01L 25/165* (2013.01)

(58) Field of Classification Search
CPC .... G01J 2003/2843; G01J 1/0271; G01J 1/44; G01S 17/894; H04N 5/2257;
(Continued)

(56) References Cited

U.S. PATENT DOCUMENTS 6,762,743 B2 * 7/2004 Yoshihara ............ G09G 3/3611
345/97
2011/0102567 A1 5/2011 Erhart
(Continued)

FOREIGN PATENT DOCUMENTS

KR 10-2012-0124369 11/2012
KR 10-2019-0047968 5/2019

OTHER PUBLICATIONS

International Search Report dated Mar. 10, 2021 in corresponding International Application No. PCT/KR2020/016946.

*Primary Examiner* — Que Tan Le
(74) *Attorney, Agent, or Firm* — Nixon & Vanderhye, P.C.

(57) ABSTRACT

An example electronic device includes: a housing: a display including a plurality of signal lines; an optical sensor module including first and second light emitting elements respectively overlapping first and second signal lines, and a light receiving element configured to collect light from the first and/or second light emitting elements that is reflected and received from an external object; and a processor. The processor is configured to control the first light emitting element based on an off-time point of time of the first signal line corresponding to brightness of the display such that the first light emitting element emits light at a first light-emitting point of time, and to control the second light emitting element based on a time difference between off-time points of time of the first and second signal lines such that the second light emitting element emits light at a second light-emitting point of time.

20 Claims, 17 Drawing Sheets

(51) Int. Cl.
*H01L 25/16* (2006.01)
*G01J 3/28* (2006.01)
*H04N 5/225* (2006.01)
*G01S 17/89* (2020.01)

(58) Field of Classification Search
CPC ...... H05B 47/11; H05B 47/135; H05B 47/14; H05B 47/155; G02B 2027/0118
USPC .................................. 250/205, 214 R, 239
See application file for complete search history.

(56) References Cited

U.S. PATENT DOCUMENTS

| | | |
|---|---|---|
| 2016/0195905 A1 | 7/2016 | Wang |
| 2018/0196931 A1 | 7/2018 | Cho et al. |
| 2018/0364869 A1 | 12/2018 | Lee et al. |

\* cited by examiner

ELECTRONIC DEVICE FOR CONTROLLING LIGHT EMITTING ELEMENTS OF OPTICAL SENSOR MODULE BASED ON DISPLAY SIGNAL LINE VOLTAGE AND OPERATING METHOD OF ELECTRONIC DEVICE

CROSS-REFERENCE TO RELATED APPLICATION

This application is based on and claims priority under 35 U.S.C. § 119 to Korean Patent Application No. 10-2019-0166099, filed on Dec. 12, 2019, in the Korean Intellectual Property Office, the disclosure of which is incorporated by reference herein in its entirety.

BACKGROUND

1) Field

The disclosure relates to an electronic device for controlling an optical sensor module and an operating method thereof.

2) Description of Related Art

As electronic devices have functional gaps that are remarkably reduced among producers thereof, the electronic devices are gradually made slim to satisfy consumer interest, and are developed to reinforce a design for lateral surfaces thereof and simultaneously to distinguish functional factors thereof.

A plurality of electronic parts for the electronic devices should be efficiently disposed inside the electronic devices, which is helpful for slimming of the electronic devices. Further, even if the plurality of electronic parts are efficiently disposed inside the electronic devices, a drop in quality of the electronic devices may be caused if functions of the electronic parts are not properly revealed, and thus all these conditions should be satisfied. Especially, a structure in which the electronic parts relevant to a large screen display are efficiently disposed may be required.

An optical sensor module such as a proximity sensor module or an illuminance sensor module is disposed on a rear surface of a display of the electronic device, and thereby the display can be expanded to substantially occupy a front surface of the electronic device. The optical sensor module may be disposed to detect an external environment through a part of a display region in an internal space of the rear surface of the display.

If the optical sensor module is disposed on the rear surface of the display of the electronic device, light applied from light emitting elements passes through a display element (e.g., an OLED element), and thereby a distortion phenomenon (e.g., a spot) of the display may occur.

SUMMARY

Embodiments of the disclosure provide a device and method of controlling an optical sensor module in an electronic device.

According to various example embodiments, an electronic device includes: a housing; a display disposed in an internal space of the housing to be at least partly visible from an outside through the housing, and including a plurality of signal lines; an optical sensor module disposed in the internal space below the display and to overlap the display, and including a first light emitting element overlapping a first signal line of the display, a second light emitting element overlapping a second signal line of the display different from the first signal line of the display, and a light receiving element including light receiving circuitry configured to collect light from the first light emitting element and/or the second light emitting element that is reflected and received from an external object; and a processor operatively connected to the display and the optical sensor module. The processor is configured to control the first light emitting element based on an off-time point of time of the first signal line corresponding to brightness of the display such that the first light emitting element emits light at a first light-emitting point of time, and to control the second light emitting element based on a time difference between the off-time points of time of the first signal line and off-time points of the second signal line such that the second light emitting element emits light at a second light-emitting point of time different from the first light-emitting point of time.

According to various example embodiments, an electronic device includes: a housing; a display disposed in an internal space of the housing, to be at least partly visible from an outside through the housing, and including a plurality of signal lines; and an optical sensor module including an optical sensor module disposed in the internal space below the display to overlap the display and operatively connected to the display, the optical display module including a first light emitting element overlapping a first signal line of the display, a second light emitting element overlapping a second signal line different from the first signal line of the display, and a light receiving element configured to collect light from the first light emitting element and/or the second light emitting element that is reflected and received from an external object. The first light emitting element configured to emit light at a first light-emitting point of time based on an off-time point of time of the first signal line corresponding to brightness of the display, and the second light emitting element configured to emit light at a second light-emitting point of time different from the first light-emitting point of time based on a time difference between off-time points of time of the first signal line and the second signal line.

According to various example embodiments, a method of operating an electronic device includes: emitting light from a first light emitting element of an optical sensor module overlapping a first signal line of a plurality of signal lines included in a display of the electronic device at a first light-emitting point of time based on an off-time point of time of the first signal line corresponding to brightness of the display; and emitting light from a second light emitting element of the optical sensor module overlapping a second signal line different from the first signal line of the plurality of signal lines at a second light-emitting point of time different from the first light-emitting point of time based on a time difference between the off-time point of time of the first signal line and an off-time point of time of the second signal line.

According to various example embodiments, an electronic device includes: a housing; a display disposed in an internal space of the housing and to be at least partly visible from an outside through the housing; an optical sensor module including an optical sensor disposed in the internal space below the display and overlapping the display; and a processor operatively connected to the display and the optical sensor module. The processor is configured to: control light emitting elements of the optical sensor module such that the light emitting elements emit light at light-emitting points of time based on off-time points of time of the display corresponding to brightness of the display, and control the light emitting elements of the optical sensor module based on the brightness of the display satisfying a designated condition such that the light emitting elements repetitively emit light a pre-defined number of times.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Hereinafter, various example embodiments will be described in greater detail with reference to the attached drawings.

Figure 1:
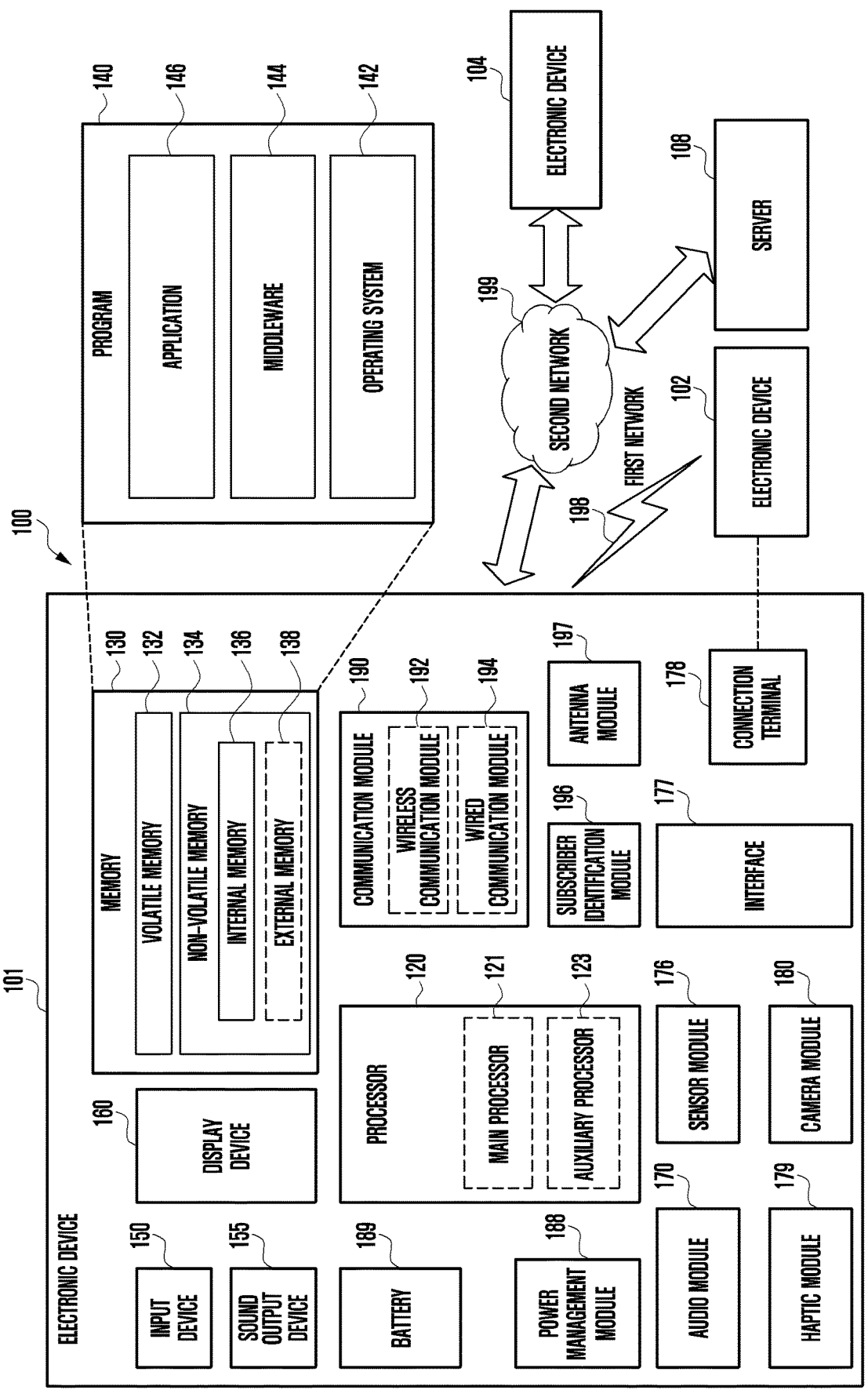
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term may not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2A:
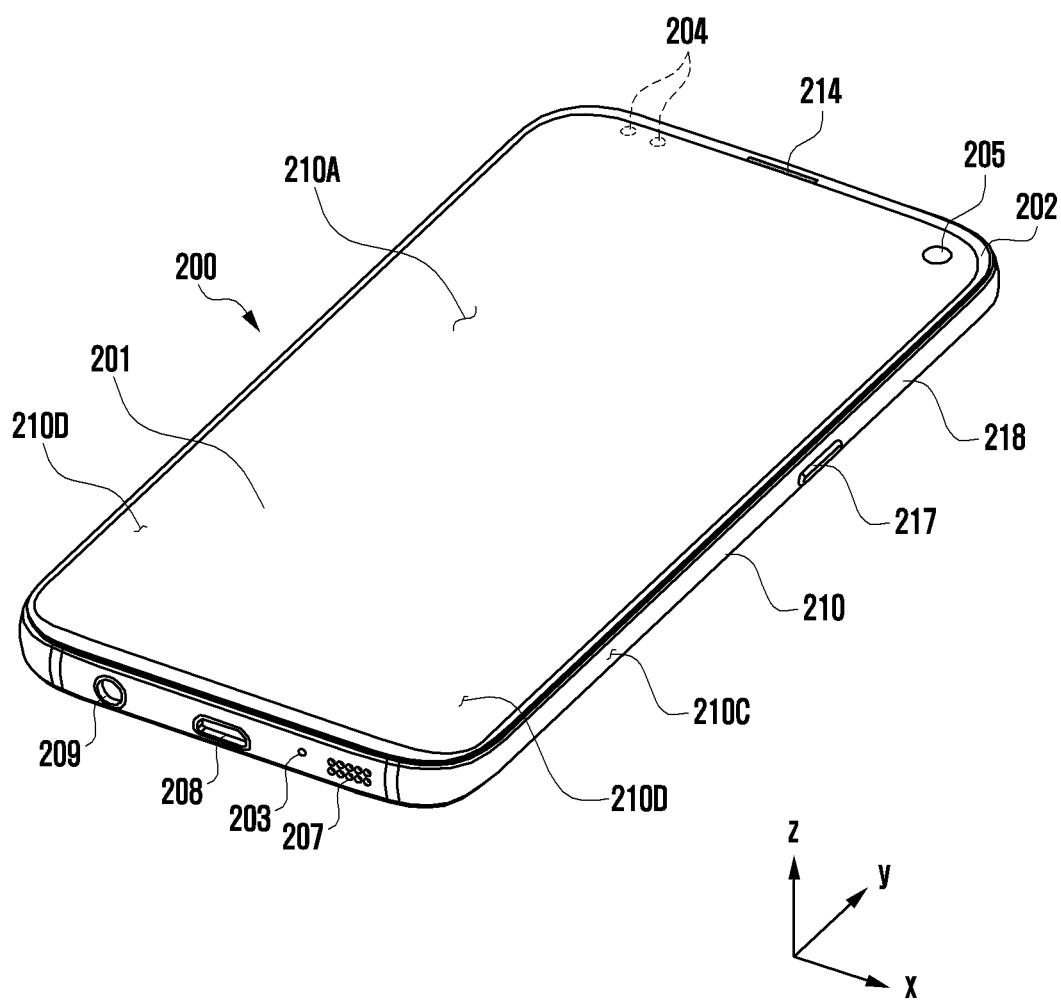
FIG. 2A is a front perspective view of the electronic device according to various embodiments.
Figure 2B:
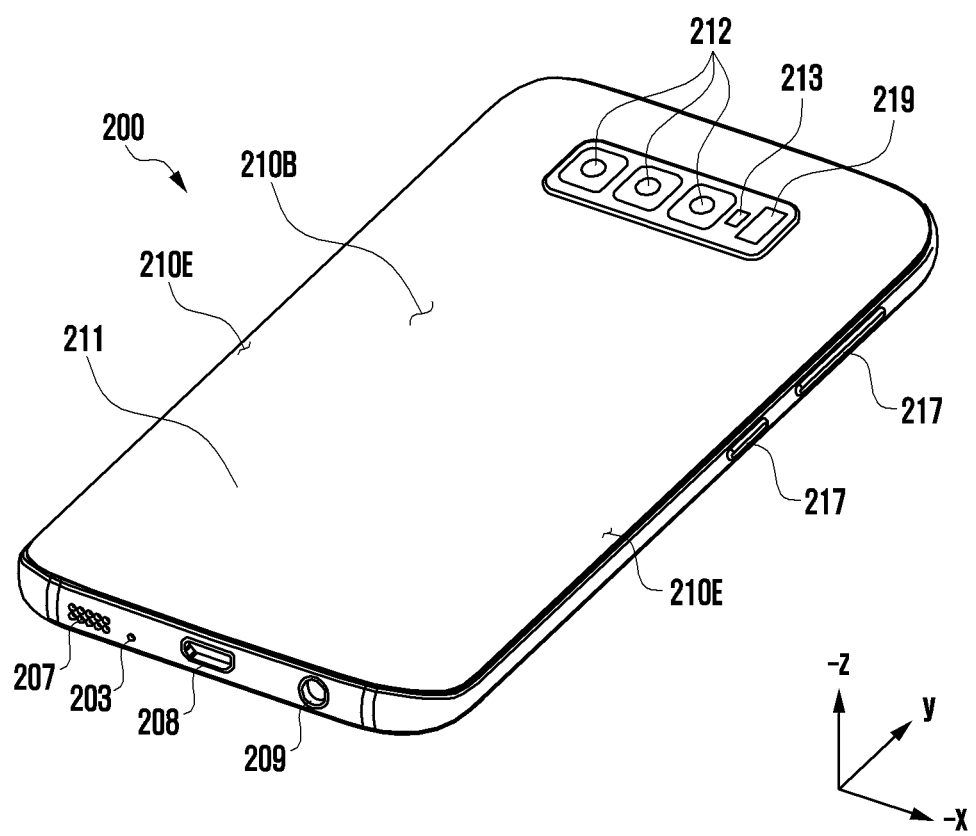
FIG. 2B is a rear perspective view of the electronic device according to various embodiment.

FIG. 2A is a front perspective view of an example mobile electronic device 200 according to various embodiments. FIG. 2B is a rear perspective view of the electronic device 200 of FIG. 2A according to various embodiments. For example, the electronic device 200 of FIGS. 2A and 2B may be the electronic device 101 of FIG. 1.

Referring to FIGS. 2A and 2B, according to various embodiments, an electronic device 200 may include a housing 210 that includes a first surface (or a front surface) 210A, a second surface (or a rear surface) 210B, and a lateral surface 210C that surrounds a space between the first surface 210A and the second surface 210B. According to an embodiment, the first surface 210A may be formed by a front plate 202, at least a part of which is substantially transparent. The second surface 210B may be formed by a substantially opaque rear plate 211. The lateral surface 210C may be joined with the front plate 202 and the rear plate 211, and be formed by a lateral bezel structure (or a "lateral member") 218. In an embodiment (not illustrated), the housing 210 may be called a structure in which some of the first surface 210A, the second surface 210B, and the lateral surface 210C of FIG. 2A and FIG. 2B are disposed.

According to various embodiments, as in FIG. 2A, the front plate 202 may include first regions 210D, which are bent and seamlessly extend from the first surface 210A toward the rear plate 211, at both long edges of the front plate 202. According to an embodiment, as in FIG. 2B, the rear plate 211 may include second regions 210E, which are bent and seamlessly extend from the second surface 210B toward the front plate 202, at both long edges thereof. According to an embodiment, the front plate 202 or the rear plate 211 may include either the first regions 210D or the second regions 210E. According to an embodiment, the front plate 202 may not include the first regions 210D, and include a flat plane that is disposed parallel to the second surface 210B. According to an embodiment, when viewed from the lateral surface of the electronic device 200, the lateral bezel structure 218 may have a first thickness (or width) on the side of the lateral surface in which neither the first regions 210D nor the second regions 210E are included, and a second thickness thinner than the first thickness on the side of the lateral surface that includes the first regions 210D or the second regions 210E.

According to various embodiments, the electronic device 200 may include at least one or more of a display 201, an input unit 203, audio output units 207 and 214, sensor modules 204 and 219, camera modules 205, 212, and 213, key input units 217, an indicator (not illustrated), or connector holes 208 and 209. According to an embodiment, the electronic device 200 may omit at least one (e.g., the key input units 217 or the indicator) of the elements, or additionally include another element.

According to an embodiment, the display 201 may be exposed through much of the front plate 202. For example, at least a part of the display 201 may be exposed through the first surface 210A and the front plate 202 at which the first regions 210D of the lateral surface 210C are disposed. The display 201 may be joined with or disposed adjacent to a touch sensor circuit, a pressure sensor capable of measuring an intensity (a pressure) of a touch, and/or a digitizer that detects a stylus pen based on a magnetic field. According to an embodiment, at least one of the sensor modules 204 and 219, and/or at least one of the key input units 217 may be disposed in the first regions 210D and/or the second regions 210E.

According to an embodiment, the input unit 203 may include a microphone. For example, the input unit 203 may include a plurality of microphones that are disposed to be able to detect a direction of a sound. According to an embodiment, the audio output units 207 and 214 may include speakers. The speakers may include an external speaker (e.g., a first audio output unit 207) and a receiver for communication (e.g., a second audio output unit 214). According to an embodiment, the input unit 203 (e.g., a microphone), the audio output units 207 and 214 (e.g., speakers), and the connector holes 208 and 209 may be disposed in an internal space of the housing 210, and be exposed to an external environment through at least one hole formed in the housing 210. According to an embodiment, the hole formed in the housing 210 may be used in common for the input unit 203 (e.g., a microphone) and the audio output units 207 and 214 (e.g., speakers). According to an embodiment, the audio output units 207 and 214 may include speakers (e.g., piezo speakers) operated with the exception of the holes formed in the housing 210. As an example, the internal space of the housing 210 may include a space that is surrounded by the first surface 210A, the second surface 210B, and the lateral surface 210C.

According to an embodiment, the sensor modules 204 and 219 may produce an electric signal or a data value that corresponds to an internal operation state of the electronic device 200 or an external environment state. For example, the sensor modules 204 and 219 may include a first sensor module 204 (e.g., a proximity sensor) and/or a second sensor module (not illustrated) (e.g., a fingerprint sensor) that is disposed on the first surface 210A of the housing 210, and/or a third sensor modules 219 (e.g., an HRM sensor) that is disposed on the second surface 210B of the housing 210. The fingerprint sensor may be disposed on the first surface 210A of the housing 210. The fingerprint sensor (e.g., an ultrasonic or optical fingerprint sensor) may be disposed below the display 201 within the first surface 210A. The electronic device 200 may further include at least one of a gesture sensor, a gyro sensor, a barometric sensor, a magnetic sensor, an acceleration sensor, a grip sensor, a color sensor, an infrared (IR) sensor, a biological sensor, a temperature sensor, a humidity sensor, or an illuminance sensor that comprise a sensor module (not illustrated).

According to an embodiment, the camera modules 205, 212, and 213 may include a first camera device 205 disposed on the first surface 210A of the electronic device 200, and a second camera device 212 and/or a flash 213 disposed on the second surface 210B. For example, the camera modules 205 and 212 may include one or more lenses, an image sensor, and/or an image signal processor. For example, the flash 213 may include a light-emitting diode or a xenon lamp. According to an embodiment, two or more lenses (wide-angle and long-distance lenses) and image sensors may be disposed on one surface of the electronic device 200.

According to an embodiment, the key input units 217 may be disposed on the lateral surface 210C of the housing 210. According to an embodiment, the electronic device 200 may not include some or all of the key input units 217 illustrated in FIGS. 2A and 2B, and the excluded key input units 217 may be implemented on the display 201 in another form such as a soft key. According to an embodiment, the key input units 217 may be implemented using the pressure sensors included in the display 201.

According to an embodiment, the indicator may be disposed on the first surface 210A of the housing 210. For example, the indicator may provide state information of the electronic device 200 in a form of light.

According to an embodiment, the connector holes 208 and 209 may include a first connector hole 208 that can hold a connector (e.g., a USB connector or an IF module (an interface connector port module)) for transmitting/receiving power and/or data to/from an external electronic device, and/or a second connector hole 209 that can hold a connector (or an earphone jack) for transmitting/receiving an audio signal to/from the external electronic device.

According to an embodiment, one camera module 205 of the camera modules 205 and 212, one sensor module 204 of the sensor modules 204 and 219, or the indicator may be disposed to be exposed through the display 201. For example, the camera module 205, the sensor module 204, or the indicator may be disposed in the internal space of the electronic device 200 to be able to be exposed to the external environment through an opening bored up to the front plate 202 of the display 201. According to an embodiment, one sensor module 204 may be disposed to perform a function thereof without being visually exposed through the front plate 202 in the internal space of the electronic device 200. In this case, a bored opening may be unnecessary in a region facing the sensor module 204 of the display 201.

Figure 3A:
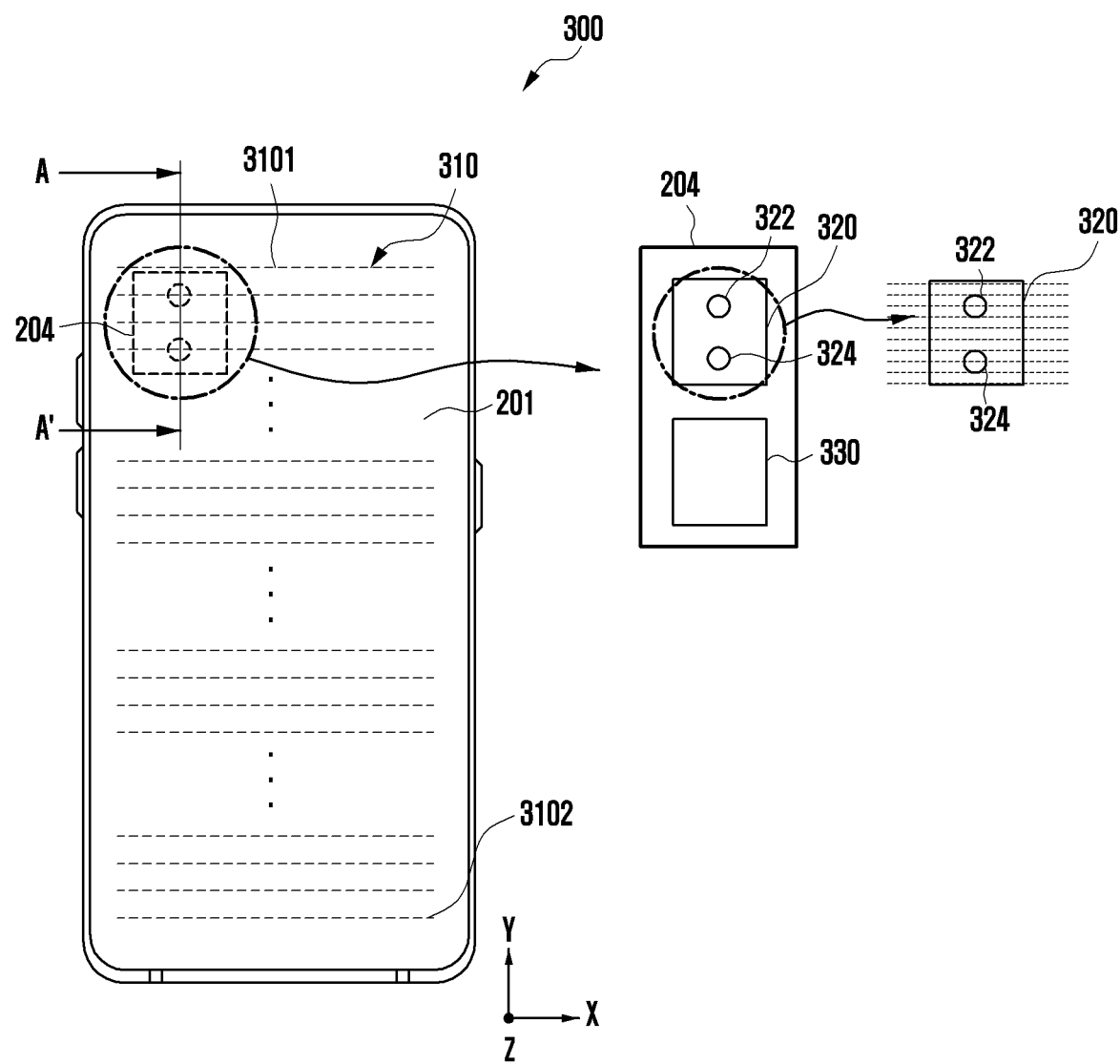
FIG. 3A is a diagram illustrating an example front surface of an electronic device according to various embodiments.
Figure 3B:
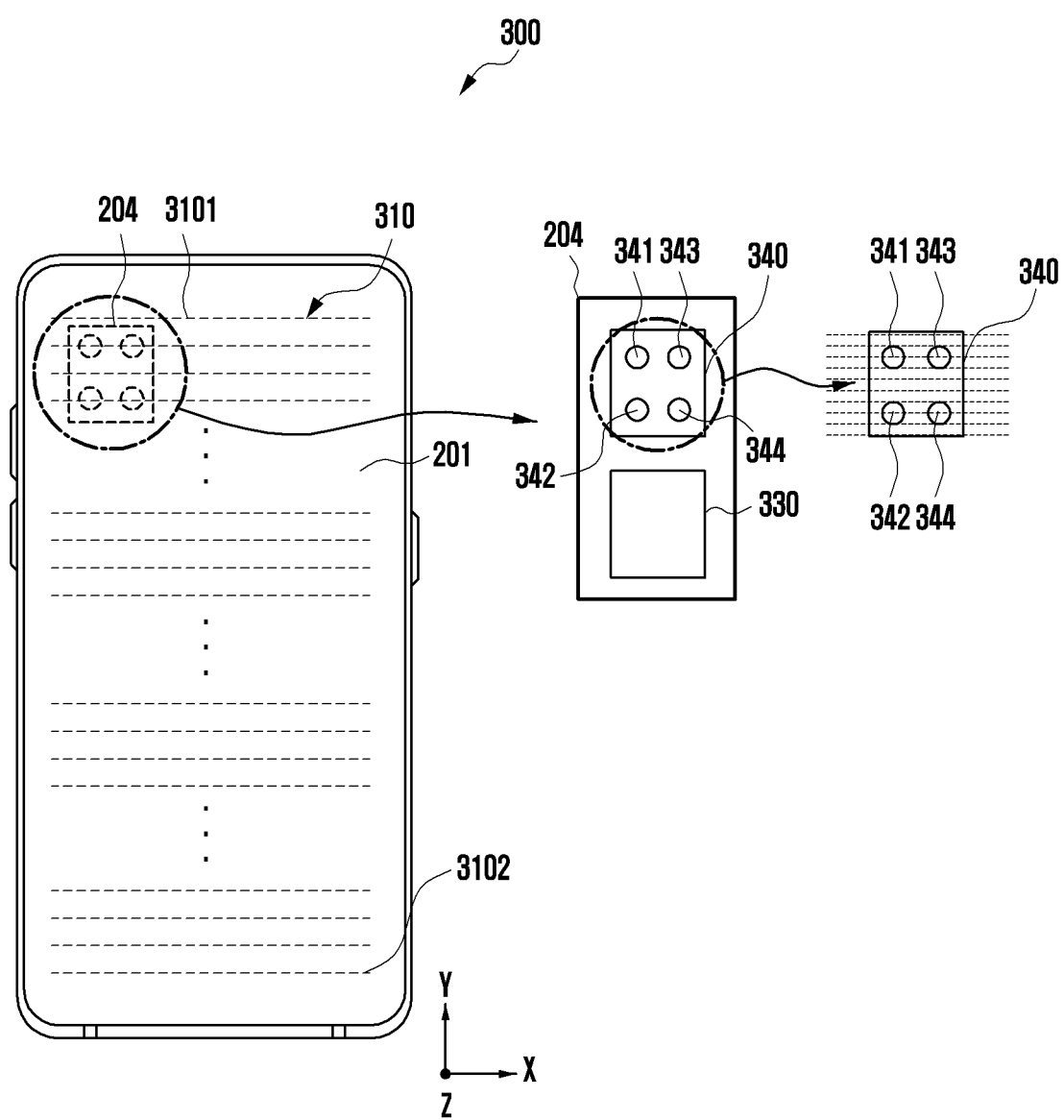
FIG. 3B is a diagram illustrating an example front surface of an electronic device according to various embodiments.
Figure 3C:
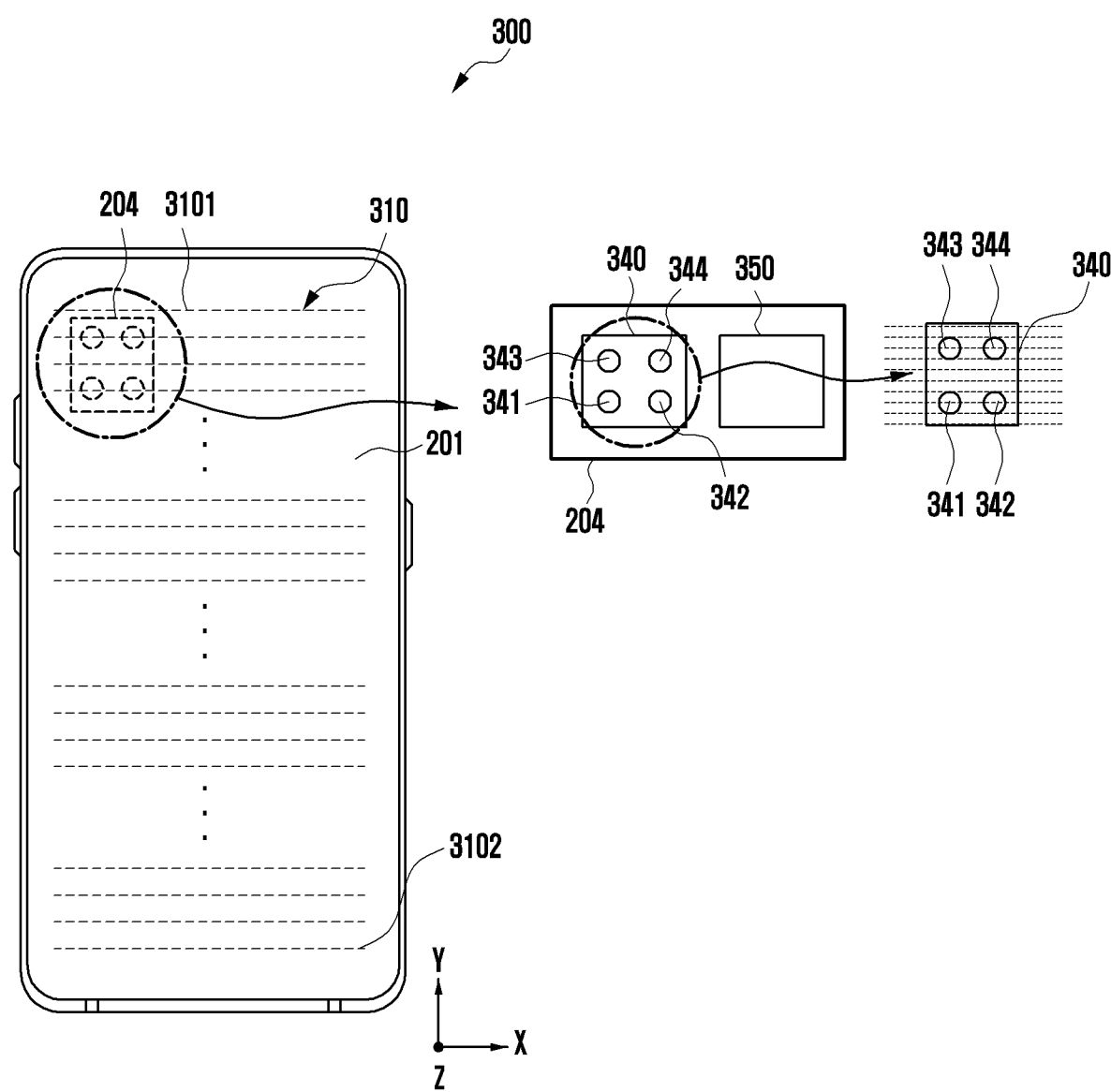
FIG. 3C is a diagram illustrating an example front surface of an electronic device according to various embodiments.
Figure 3D:
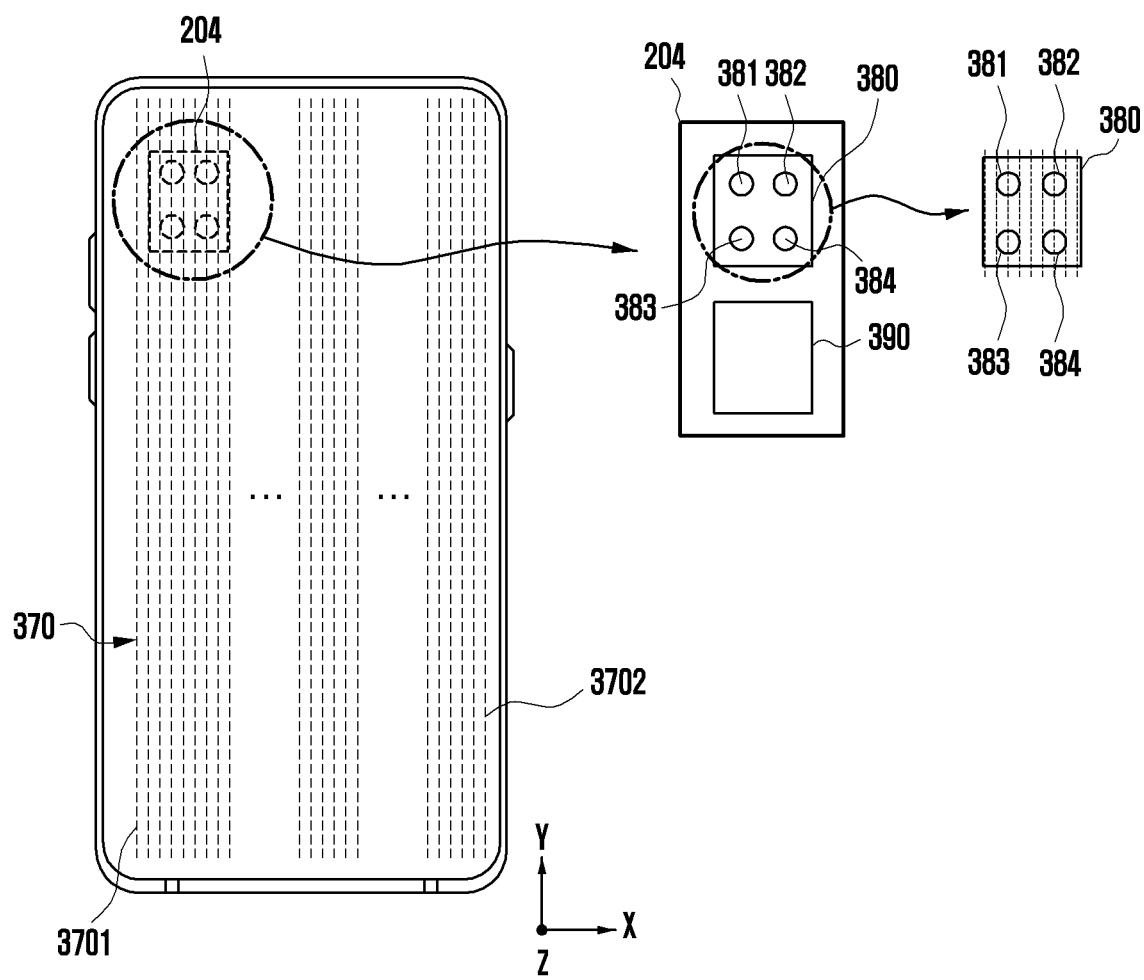
FIG. 3D is a diagram illustrating an example front surface of an electronic device according to various embodiments.

FIG. 3A is a diagram illustrating an example front surface of an electronic device according to various embodiments, FIG. 3B is a diagram illustrating an example front surface of an electronic device according to various embodiments, FIG. 3C is a diagram illustrating an example front surface of an electronic device according to various embodiments, and FIG. 3D is a diagram illustrating an example front surface of an electronic device according to various embodiments. For example, an electronic device 300 may be the electronic device 101 of FIG. 1 or the electronic device 200 of FIGS. 2A and 2B.

According to various embodiments, as in FIGS. 3A, 3B and 3C, a display 201 may include a plurality of signal lines 310 that are disposed in a first direction (e.g., a y-axial direction) of the electronic device 300. According to an embodiment, the number of signal lines 310 may correspond to the number of pixels in the first direction (e.g., the y-axial direction) in a resolution of the display 201. For example, the number of signal lines 310 may correspond to the number of pixels (e.g., 3040) in the first direction (e.g., the y-axial direction) if the display 201 has a resolution (e.g., 3040×1440) of quad high definition display plus (QHD+). As an example, the signal lines 310 may include electrical paths (e.g., gate lines) that correspond to a plurality of pixels disposed on the same axis (e.g., an x axis).

Referring to FIG. 3D, according to various embodiments, the display 201 may include a plurality of signal lines 370 that are disposed in a second direction (e.g., an x-axial direction) of the electronic device 300. According to an embodiment, the number of signal lines 370 may correspond to the number of pixels in the second direction (e.g., the x-axial direction) in the resolution of the display 201. As an example, the signal lines 370 may include electrical paths (e.g., gate lines) that correspond to a plurality of pixels disposed on the same axis (e.g., a y axis).

According to an embodiment, the plurality of signal lines 310 or 370 may be supplied with a voltage in order, and output designated image data. For example, to output the designated image data to the display 201, the electronic device 300 may supply the voltage to a first signal line 3101 or 3701 at a first point of time, and supply the voltage to a last signal line 3102 or 3702 at a second point of time later than the first point of time. As an example, the last signal line 3102 or 3702 may be supplied with the voltage at a relatively delayed point of time compared to the first signal line 3101 or 3701.

According to various embodiments, the sensor module 204 may include an optical sensor module that includes a plurality of light emitting elements (e.g., two or four light emitting elements) 322 and 324 or 341, 342, 343 and 344 or 381, 382, 383 and 384. According to an embodiment, the sensor module 204 (e.g., an optical sensor module) may be disposed on a rear surface (below) of the display 201 in an internal space of the housing 210. For example, the sensor module 204 (e.g., an optical sensor module) may be disposed in an unbored region of the display 201 in the internal space of the housing 210, and may not be visually exposed through the front plate 202 of the display 201.

According to various embodiments, the sensor module 204 (e.g., an optical sensor module) may include a light emitting module 320, 340, or 380 and a light receiving module 330, 350, or 390. The light emitting module 320, 340, or 380 may include a plurality of light emitting elements that are disposed on different signal lines of the display 201. According to an embodiment, as in FIG. 3A, the light emitting module 320 may include two light emitting elements 322 and 324 disposed on different signal lines. For example, a first light emitting element 322 and a second light emitting element 324 may be disposed apart from each other by a fixed distance (e.g., about 500 μm) in order to reduce an influence of interference between the light emitting elements 322 and 324. As an example, the first light emitting element 322 may be disposed to overlap at least a part of the first signal line of the plurality of signal lines 310. The second light emitting element 324 may be disposed to overlap at least a part of the second signal line different from the first signal line of the plurality of signal lines 310. Thus, the first light emitting element 322 and the second light emitting element 324 may emit light at different points of time based on a delay between the signal lines.

According to an embodiment, as in FIG. 3B, the light emitting module 340 may include four light emitting elements 341, 342, 343, and 344 disposed on different signal lines. For example, a first light emitting element 341 and a third light emitting element 343, or a second light emitting element 342 and a fourth light emitting element 344 may be disposed apart from each other by a first reference distance in order to reduce an influence of interference between the light emitting elements 341, 342, 343, and 344. As an example, the first light emitting element 341 and the third light emitting element 343 may be disposed on the same signal line (e.g., the first signal line) to be apart from each other by the first reference distance. As an example, the second light emitting element 342 and the fourth light emitting element 344 may be disposed on the same signal line (e.g., the second signal line) to be apart from each other by the first reference distance. For example, the first light emitting element 341 and the second light emitting element 342, or the third light emitting element 343 and the fourth light emitting element 344 may be disposed apart from each other by a second reference distance in order to reduce the influence of the interference between the light emitting elements 341, 342, 343, and 344. As an example, the first light emitting element 341 and the second light emitting element 342 may be disposed on different signal lines spaced apart from each other by the second reference distance. As an example, the third light emitting element 343 and the fourth light emitting element 344 may be disposed on different signal lines spaced apart from each other by the second reference distance. As an example, the first reference distance and the second reference distance may be set identically or differently. For example, the first light emitting element 341 and the third light emitting element 343 may be disposed to overlap at least a part of the first signal line of the plurality of signal lines 310. The second light emitting element 342 and the fourth light emitting element 344 may be disposed to overlap at least a part of the second signal line different from the first signal line of the plurality of signal lines 310. Thus, light emitting points of time of the first and third light emitting elements 341 and 343 and light emitting points of time of the second and fourth light emitting elements 342 and 344 may be differently set based on a voltage supplying point of time of the signal line on which the light emitting element 341, 342, 343, or 344 is disposed.

According to an embodiment, as in FIG. 3C, the light emitting module 340 may be disposed to be rotated by a first angle (e.g., 90 degrees) based on the sensor module 204 (e.g., an optical sensor module) of FIG. 3B. For example, the third light emitting element 343 and the fourth light emitting element 344 may be disposed to overlap at least a part of the first signal line of the plurality of signal lines 310. The first light emitting element 341 and the second light emitting element 342 may be disposed to overlap at least a part of the second signal line different from the first signal line of the plurality of signal lines 310. Thus, light emitting points of time of the third and fourth light emitting elements 343 and 344 and light emitting points of time of the first and second light emitting elements 341 and 342 may be differently set based on the voltage supplying point of time of the signal line on which the light emitting element 341, 342, 343, or 344 is disposed. As an example, a set of the light emitting elements interlocked mutually based on a shape in which the sensor module 204 (e.g., an optical sensor module) configured as one package is disposed may be changed.

According to an embodiment, as in FIG. 3D, the light emitting module 380 may include four light emitting elements 381, 382, 383, and 384 disposed on different signal lines. For example, a first light emitting element 381 and a third light emitting element 383 may be disposed to overlap at least a part of a third signal line of the plurality of signal lines 370. A second light emitting element 382 and a fourth light emitting element 384 may be disposed to overlap at least a part of a fourth signal line different from the third signal line of the plurality of signal lines 370. Thus, light emitting points of time of the first and third light emitting elements 381 and 383 and light emitting points of time of the second and fourth light emitting elements 382 and 384 may be differently set based on a voltage supplying point of time of the signal line on which the light emitting element 381, 382, 383, or 384 is disposed. As an example, the first light emitting element 381 and the third light emitting element 383, or the second light emitting element 382 and the fourth light emitting element 384 may be disposed apart from each other by a third reference distance in order to reduce an influence of interference between the light emitting elements 381, 382, 383, and 384. As an example, the first light emitting element 381 and the third light emitting element 383 may be disposed on the same signal line (e.g., the first signal line) to be apart from each other by the third reference distance. As an example, the second light emitting element 382 and the fourth light emitting element 384 may be disposed on the same signal line (e.g., the second signal line) to be apart from each other by the third reference distance. As an example, the first light emitting element 381 and the second light emitting element 382, or the third light emitting element 383 and the fourth light emitting element 384 may be disposed apart from each other by a fourth reference distance in order to reduce the influence of the interference between the light emitting elements 381, 382, 383, and 384. As an example, the third reference distance and the fourth reference distance may be set identically or differently. As an example, the first light emitting element 381 and the second light emitting element 382 may be disposed on different signal lines spaced apart from each other by the fourth reference distance. As an example, the third light emitting element 383 and the fourth light emitting element 384 may be disposed on different signal lines spaced apart from each other by the fourth reference distance.

According to an embodiment, if light applied by the light emitting module 320, 340, or 380 is reflected by an external object, the light receiving module 330, 350, or 390 may collect the light reflected by the external object. As an example, as in FIGS. 3A, 3B and 3D, the light receiving module 330 or 390 may be disposed in a third direction (e.g., a −y-axial direction) of the light emitting module 320, 340, or 380. As an example, as in FIG. 3C, the light receiving module 350 may be disposed in a second direction (e.g., an x-axial direction) of the light emitting module 340 based on a disposed shape of the sensor module 204. As an example, the light receiving module 330, 350, or 390 may include, for example, an infrared camera, a photo diode, or the like.

According to various embodiments, the light emitting element 322, 324, 341, 342, 343, 344, 381, 382, 383, or 384 included in the light emitting module 320, 340, or 380 may be disposed to overlap two or more signal lines.

Figure 4:
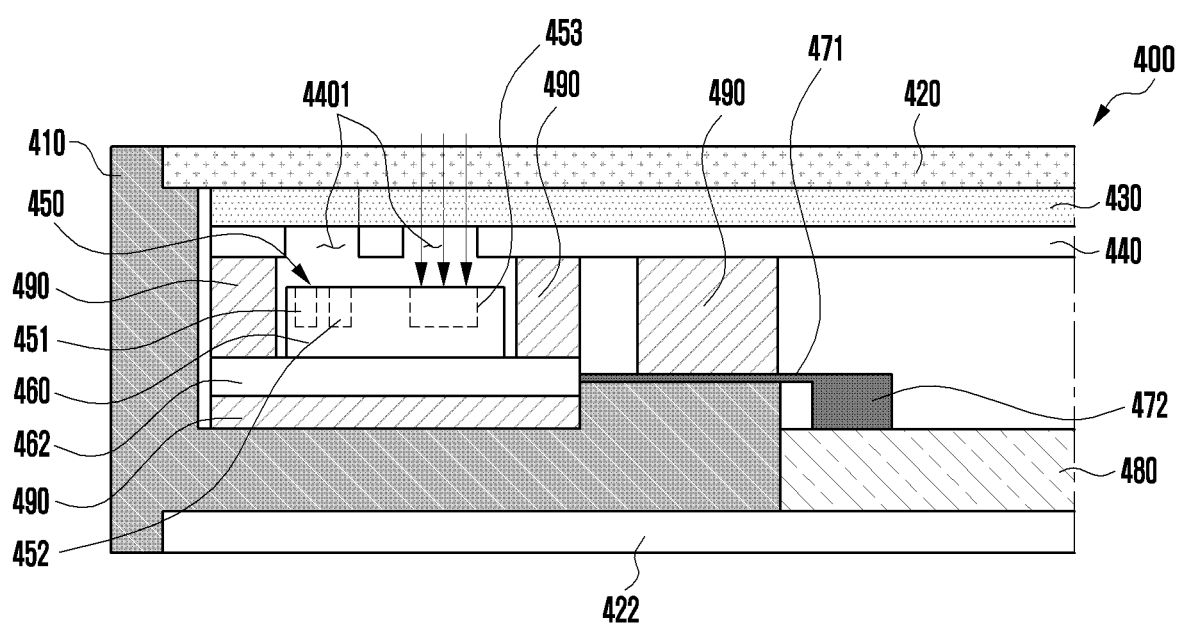
FIG. 4 is a partial sectional view of an electronic device including an optical sensor module according to various embodiments.

FIG. 4 is a partial sectional view of an electronic device including an optical sensor module according to various embodiments. FIG. 4 is a sectional view taken along line A-A' of the electronic device 300 of FIG. 3A. For example, an electronic device 400 may be the electronic device 101 of FIG. 1, the electronic device 200 of FIGS. 2A and 2B, or the electronic device 300 of FIG. 3A, 3B, 3C, or 3D.

Referring to FIG. 4, according to various embodiments, the electronic device 400 may include a housing structure (e.g., the housing 210 of FIG. 2A) that includes a front cover 420 (e.g., a cover member, a front plate, a front window, or a first plate), a rear cover 422 (e.g., a rear cover member, a rear plate, a rear window, or a second plate) that is directed in a direction opposite to the front cover 420, and a lateral member (e.g., a bezel) 410 that surrounds an internal space between the front cover 420 and the rear cover 422.

According to various embodiments, the electronic device 400 may include a display panel 430 that is attached to the front cover 420 to be able to be seen from the outside in the internal space through at least a part of the front cover 420, and a subsidiary material layer 440 (e.g., a cover panel) that is attached to a rear surface of the display panel 430. As an example, the display panel 430 and the subsidiary material layer 440 may be referred to as a display (e.g., the display 201 of FIG. 2A).

According to various embodiments, the electronic device 400 may include an optical sensor module 450 that is disposed in the internal space attached to the subsidiary material layer 440. According to an embodiment, when the display 201 is viewed from above, the optical sensor module 450 may be disposed to overlap at least a partial region of the rear surface of the display panel 430. According to an embodiment, because the subsidiary material layer 440 does not transmit light, the subsidiary material layer 440 may include at least one through-hole 4401 that is formed up to the display panel 430 in a region that faces light emitting elements 451 and 452 and a light receiving module 453.

According to an embodiment, the at least one through-hole 4401 may be formed in a region corresponding to the first light emitting element 451, a region corresponding to the second light emitting element 452, and a region corresponding to the light receiving module 453. According to an embodiment, the at least one through-hole 4401 may be formed, as a single hole, from the regions corresponding to the light emitting elements 451 and 452 to the region corresponding to the light receiving module 453.

According to various embodiments, the optical sensor module 450 may include a flexible printed circuit board (FPCB) 462 (e.g., a printed circuit board), a module housing 460 that is mounted on the FPCB 462, and the light emitting elements 451 and 452 and the light receiving module 453 that are disposed apart in the module housing 460 to be exposed at least partly and are electrically connected to the FPCB 462. According to an embodiment, the optical sensor module 450 may include an extension 471 that extends from the FPCB 462 and an electric connector 472 that is mounted on an end of the extension 471. According to an embodiment, the electric connector 472 may be electrically connected to a printed circuit board 480 (e.g., a main printed circuit board) that is separately disposed in the internal space of the electronic device 400.

According to various embodiments, the optical sensor module 450 may be disposed in such a way that the FPCB 462 is attached to the subsidiary material layer 440 on the rear surface of the display 201 through at least one adhesive member, e.g., a tape member 490 (e.g., a waterproof member or a waterproof tape).

According to various embodiments, because the optical sensor module 450 has a disposition configuration in which the FPCB 462 provided separately from the printed circuit board 480 is directly attached to the rear surface of the display 201, a detection error caused by a tilt tolerance (e.g., the optical sensor module is disposed on the tilt) can be prevented and/or reduced, and can provide efficient disposition design in which the optical sensor module 450 can be disposed up to an uppermost end of the display 201 separately from the printed circuit board 480.

Figure 5:
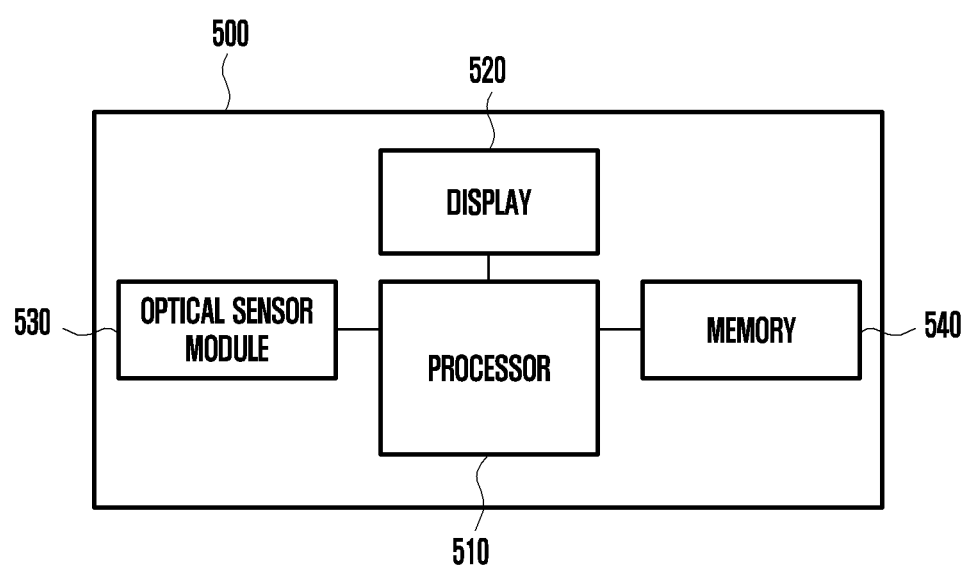
FIG. 5 is a block diagram illustrating an example electronic device for controlling an optical sensor module according to various embodiments.

FIG. 5 is a block diagram illustrating an example electronic device for controlling an optical sensor module according to various embodiments. For example, an electronic device 500 may be the electronic device 101 of FIG. 1, the electronic device 200 of FIGS. 2A and 2B, the electronic device 300 of FIG. 3A, 3B, 3C, or 3D, or the electronic device 400 of FIG. 4.

Referring to FIG. 5, according to various embodiments, electronic device 500 may include a processor (e.g., including processing circuitry) 510, a display 520, an optical sensor module (e.g., including an optical sensor) 530, and a memory 540. According to an embodiment, the processor 510 may be the same as or similar to the processor 120 of FIG. 1, and be included in the processor 120. The display 520 may be the same as or similar to the display device 160 of FIG. 1, and be included in the display device 160. The optical sensor module 530 may be the same as or similar to the sensor module 176 of FIG. 1, and be included in the sensor module 176. The memory 540 may be the same as or similar to the memory 130 of FIG. 1, and be included in the memory 130. According to an embodiment, the electronic device 500 has a configuration in which at least one (e.g., the display 520) of these elements may be omitted, or one or more different elements may be added. As an example, the processor 510 may include, for example, and without limitation, an application processor (AP), a sensor hub processor, a display drive integrated circuit (DDI), or the like.

According to various embodiments, the processor 510 may include various processing circuitry and control the optical sensor module 530 such that an activation point of time of the optical sensor module 530 is synchronized with the display 520. According to an embodiment, the processor 510 may control the optical sensor module 530 such that the optical sensor module 530 emits light based on an deactivation (off-time) section of the display 520 which corresponds to brightness of the display 520. A point of time at which the optical sensor module 530 emits light may be delayed to a point of time at which the optical sensor module 530 is deactivated by the processor 510 based on the brightness of the display 520. For example, the display 520 may be operated in one duty cycle for one frame in a section where the brightness thereof is relatively high. In this case, the processor 510 may control the optical sensor module 530 such that the optical sensor module 530 emits light based on a porch section of the display 520. As an example, the porch section may include a section where a data current of the signal lines included in the display 520 is turned off in one frame section. For example, the porch section may be a section where no data is recorded in each signal line of the display 520. As an example, a register may be initialized for the porch section. As an example, in the case where a frame displays image content on the display 520, one frame may represent one still image in units of the still image for displaying the image content.

According to an embodiment, the processor 510 may control the optical sensor module 530 such that the optical sensor module 530 emits light based on the deactivation (off-time) section of the display 520 which corresponds to the brightness of the display 520 and a color of the content displayed on the display 520. For example, in the case where the color of the content displayed on the display 520 is a white color in a state in which the brightness of the display 520 is relatively high, the processor 510 may control the optical sensor module 530 such that the optical sensor module 530 emits light before the porch section (e.g., the off-time section) of the display 520. As an example, in the case where the color of the content displayed on the display 520 is a black color in the state in which the brightness of the display 520 is relatively high, the processor 510 may control the optical sensor module 530 such that the optical sensor module 530 emits light within the porch section (e.g., the off-time section) of the display 520.

According to an embodiment, the processor 510 may be synchronized with the display 520 to control the optical sensor module 530 such that the optical sensor module 530 emits light a plurality of times. For example, the display 520 may be operated in a plurality of duty cycles (e.g., four duty cycles) for one frame in a section where the brightness thereof is relatively low. In this case, the processor 510 may control the optical sensor module 530 such that the optical sensor module 530 emits light in each section where the display 520 is deactivated based on the duty cycle of the display 520. As an example, an off-time period of the optical sensor module 530 may be set based on scanning rate (e.g., 60 Hz) of the display 520. As an example, the optical sensor module 530 emits light a plurality of times, and thereby the electronic device 500 may improve sensitivity of the optical sensor module 530. As an example, the processor 510 may control the number of times which the optical sensor module 530 emits light based on the sensitivity of the optical sensor module 530. As an example, if a level of the sensitivity of the optical sensor module 530 is lower than a reference level, the processor 510 may control the optical sensor module 530 such that the optical sensor module 530 emits light a plurality of times. As an example, the sensitivity of the optical sensor module 530 may be checked based on an amount of light (or intensity of light) collected through the light receiving module based on light applied from the light emitting elements for a reference time.

According to various embodiments, the processor 510 may control a light-emitting point of time of the light emitting element based on a position at which the light emitting element (e.g., the light emitting element 322 or 324 of FIG. 3A) included in the optical sensor module 530 is disposed. According to an embodiment, the optical sensor module 530 may include the plurality of light emitting elements (e.g., the light emitting elements 322 and 324 of FIG. 3A) that are disposed to overlap the different signal lines of the plurality of signal lines (e.g., the signal lines 310 of FIG. 3A) included in the display 520. The processor 510 may set the light-emitting point of time of the light emitting element based on an off-time point of time (or an off-time section) of the signal line on which each light emitting element (e.g., the light emitting element 322 or 324 of FIG. 3A) is disposed. For example, the processor 510 may control the first light emitting element 322 such that the first light emitting element 322 emits light based on an off-time point of time of the first signal line in FIG. 3A. The processor 510 may delay a time for which the second light emitting element 324 emits light by a voltage supplying time difference between the first signal line and the second signal line on which the second light emitting element 324, and control the second light emitting element 324 such that the second light emitting element 324 emits light. As an example, a light-emitting delay time between the first light emitting element 322 and the second light emitting element 324 may be set based on an interval between the first signal line and the second signal line and/or the number of the signal lines disposed between the first signal line and the second signal line. As an example, the processor 510 may control the plurality of light emitting elements (e.g., the first light emitting element 341 and the third light emitting element 343 of FIG. 3B) disposed on the same signal line such that the plurality of light emitting elements emit light at the same point of time. According to an embodiment, the processor 510 may set the light-emitting point of time of each light emitting element based on a difference between pixels at which the light emitting elements are disposed. For example, a voltage supplying time difference may occur based on a difference between positions (e.g., pixels) at which the first light emitting element 341 and the third light emitting element 343 disposed on the first signal line as in FIG. 3B are disposed on the first signal line. Thus, the processor 510 may differently set the light-emitting points of time of the first light emitting element 341 and the third light emitting element 343 disposed on the first signal line as in FIG. 3B based on the position (e.g., the pixel) of the light emitting element 341 or 343 disposed on the first signal line.

According to various embodiments, the display 520 may display information related to driving of the electronic device 500. According to an embodiment, the display 520 may include a plurality of signal lines (e.g., the signal lines 310 of FIG. 3A or the signal lines 370 of FIG. 3D) that are disposed in a first direction (e.g., the y-axial direction of FIG. 3A) or a second direction (e.g., the x-axial direction of FIG. 3D). The plurality of signal lines may supply a voltage to the signal lines in order, and output designated information. As an example, the display 520 may include an organic light emitting diode (OLED) display or a quantum-dot LED (QLED) display.

According to various embodiments, the optical sensor module (e.g., the optical sensor) 530 may include a light emitting module including at least one light emitting element that applies light, and a light receiving module including at least one light receiving element that receives light reflected by an external object. According to an embodiment, the light emitting module of the optical sensor module 530 may emit light at a light-emitting point of time synchronized with the display 520 under the control of the processor 510. As an example, the light-emitting point of time synchronized with the display 520 may be set based on an deactivation (off-time) section of the display 520 which corresponds to brightness of the display 520 and/or a color of content displayed on the display 520.

According to an embodiment, the light emitting module of the optical sensor module 530 may include a plurality of light emitting elements. As an example, the plurality of light emitting elements may be disposed to overlap the same signal line or different signal lines of the plurality of signal lines included in the display 520. For example, in the case where the plurality of light emitting elements are disposed to overlap the different signal lines, light may be applied at different points of time based on an off-time point of time (or an off-time section) of the signal line that overlaps each light emitting element. As an example, the optical sensor module 530 may include, for example, and without limitation, at least one of a camera module, an ultraviolet (UV) sensor module, an iris sensor module, a spectral sensor module, an infrared sensor module, an RGB sensor module, a time-of-flight (TOF) sensor module, or the like.

According to various embodiments, the memory 540 may store data that is used or produced by at least one element (e.g., the processor 510, the display 520, or the optical sensor module 530) of the electronic device 500. For example, the data may include input data or output data of software related to the element and a command related to the software.

According to various embodiments, the optical sensor module 530 may be operated by direct connection to the display 520 and synchronization with the display 520. According to an embodiment, the optical sensor module 530 may set light-emitting points of time of the light emitting elements based on information about the off-time section corresponding to the brightness of the display 520 which is provided from the display 520.

According to various embodiments, in the case where a scanning rate of the display 520 can be changed, the processor 510 may control a light-emitting points of time of the optical sensor module 530 based on a change in the scanning rate of the display 520. According to an embodiment, the off-time section of the display 520 which corresponds to the brightness of the display 520 may be set based on the scanning rate of the display 520. For example, a length of the porch section of the display 520 may be changed based on the scanning rate of the display 520. As an example, as the scanning rate of the display 520 becomes relatively low, the length of the porch section may be set to be relatively long. Thus, the processor 510 may control the scanning rate of the display 520 to adjust driving times of the light emitting elements. As an example, in the case where the scanning rate of the display 520 is relatively lowered, the processor 510 may set light-emitting times of the light emitting elements to be relatively long based on the length of the porch section that is set to be relatively long. As an example, the processor 510 may control the scanning rate of the entire display 520, or control a scanning rate of at least a partial region of the display 520. As an example, the at least a partial region of the display 520 may include at least one signal line that overlaps the light emitting elements, or at least one signal line that overlaps the optical sensor module 530.

According to various example embodiments, an electronic device (e.g., the electronic device 101 of FIG. 1, the electronic device 200 of FIGS. 2A and 2B, the electronic device 300 of FIG. 3A, 3B, 3C, or 3D, the electronic device 400 of FIG. 4, or the electronic device 500 of FIG. 5) may include: a housing (e.g., the housing 210 of FIG. 2A), a display (e.g., the display 520 of FIG. 5) disposed in an internal space of the housing to be at least partly visible from outside through the housing and including a plurality of signal lines, an optical sensor module (e.g., the optical sensor module 530 of FIG. 5) disposed in the internal space below the display and overlapping the display, the optical sensor module including a first light emitting element (e.g., the first light emitting element 322 or 341 of FIG. 3A or 3B) disposed to overlap a first signal line of the display, a second light emitting element (e.g., the second light emitting element 324 or 342 of FIG. 3A or 3B) disposed to overlap a second signal line of the display different from the first signal line of the display, and a light receiving element (e.g., the light receiving module 330 of FIG. 3A or 3B) configured to collect light from the first light emitting element and/or the second light emitting element that is reflected and received from an external object, and a processor (e.g., the processor 510 of FIG. 5) operatively connected to the display and the optical sensor module, wherein the processor may be configured to: control the first light emitting element based on an off-time point of time of the first signal line corresponding to a brightness of the display such that the first light emitting element emits light at a first light-emitting point of time, and control the second light emitting element based on a time difference between off-time points of time of the first signal line and the second signal line such that the second light emitting element emits light at a second light-emitting point of time different from the first light-emitting point of time.

According to various example embodiments, the optical sensor module may further include a third light emitting element (e.g., the third light emitting element 343 of FIG. 3B) disposed to overlap the first signal line of the display, and a fourth light emitting element (e.g., the fourth light emitting element 344 of FIG. 3B) disposed to overlap the second signal line of the display.

According to various example embodiments, the first light emitting element and the third light emitting element, and the second light emitting element and the fourth light emitting element may be disposed apart from each other by a first reference distance, and the first light emitting element and the second light emitting element, and the third light emitting element and the fourth light emitting element may be disposed apart from each other by a second reference distance.

According to various example embodiments, the processor may be configured to check a time difference between the off-time points of time of the first signal line and the second signal line based on the second reference distance.

According to various example embodiments, the processor may be configured to: control the first light emitting element and the third light emitting element overlapping the first signal line such that the first light emitting element and the third light emitting element emit light at the first light-emitting point of time, and control the second light emitting element and the fourth light emitting element overlapping the second signal line such that the second light emitting element and the fourth light emitting element emit light at the second light-emitting point of time.

According to various example embodiments, the processor may be configured to check a time difference between the off-time points of time of the first signal line and the second signal line based on the number of third signal lines disposed between the first signal line and the second signal line.

According to various example embodiments, the processor may be configured to set the first light-emitting point of time at which the first light emitting element emits light based on the off-time point of time of the first signal line corresponding to the brightness of the display and at least some colors of the display in which the first signal line is included.

According to various example embodiments, the optical sensor module may include at least one of a camera, an ultraviolet (UV) sensor, an iris sensor, a spectral sensor, an infrared sensor, an RGB sensor, or a time-of-flight (TOF) sensor.

According to various example embodiments, an electronic device (e.g., the electronic device 101 of FIG. 1, the electronic device 200 of FIGS. 2A and 2B, the electronic device 300 of FIG. 3A, 3B, 3C, or 3D, the electronic device 400 of FIG. 4, or the electronic device 500 of FIG. 5) may include: a housing (e.g., the housing 210 of FIG. 2A), a display (e.g., the display 520 of FIG. 5) disposed in an internal space of the housing to be at least partly visible from outside through the housing and including a plurality of signal lines, and an optical sensor module including at least one optical sensor (e.g., the optical sensor module 530 of FIG. 5) disposed in the internal space below the display and overlapping the display, the optical sensor module including a first light emitting element (e.g., the first light emitting element 322 or 341 of FIG. 3A or 3B) overlapping a first signal line of the display, a second light emitting element (e.g., the second light emitting element 324 or 342 of FIG. 3A or 3B) overlapping a second signal line different from the first signal line of the display, and a light receiving element (e.g., the light receiving module 330 of FIG. 3A or 3B) configured to collect light from the first light emitting element and/or the second light emitting element that is reflected and received from an external object, wherein the first light emitting element may emit light at a first light-emitting point of time based on an off-time point of time of the first signal line corresponding to brightness of the display, and the second light emitting element may emit light at a second light-emitting point of time different from the first light-emitting point of time based on a time difference between the off-time points of time of the first signal line and the second signal line.

According to various example embodiments, the optical sensor module may be configured to check the first light-emitting point of time of the first light emitting element based on information related to the off-time point of time corresponding to the brightness of the display provided from the display.

According to various example embodiments, the optical sensor module may further include a third light emitting element (e.g., the third light emitting element 343 of FIG. 3B) overlapping the first signal line of the display, and a fourth light emitting element (e.g., the fourth light emitting element 344 of FIG. 3B) overlapping the second signal line of the display. The third light emitting element may be configured to emit light at the first light-emitting point of time, and the fourth light emitting element may be configured to emit light at the second light-emitting point of time.

According to various example embodiments, the first light emitting element and the third light emitting element, and the second light emitting element and the fourth light emitting element may be disposed apart from each other by a first reference distance, and the first light emitting element and the second light emitting element, and the third light emitting element and the fourth light emitting element may be disposed apart from each other by a second reference distance.

According to various example embodiments, an electronic device (e.g., the electronic device 101 of FIG. 1, the electronic device 200 of FIGS. 2A and 2B, the electronic device 300 of FIG. 3A, 3B, 3C, or 3D, the electronic device 400 of FIG. 4, or the electronic device 500 of FIG. 5) may include: a housing (e.g., the housing 210 of FIG. 2A), a display (e.g., the display 201 of FIG. 2A or the display 520 of FIG. 5) disposed in an internal space of the housing to be at least partly visible from outside through the housing and including a plurality of signal lines, an optical sensor module (e.g., the first sensor module 204 of FIG. 2A or the optical sensor module 530 of FIG. 5) including at least one optical sensor disposed in the internal space below the display and overlapping the display, and a processor (e.g., the processor 510 of FIG. 5) operatively connected to the display and the optical sensor module, wherein the processor may be configured to: control light emitting elements of the optical sensor module such that the light emitting elements emit light at light-emitting points of time based on off-time points of time of the display corresponding to brightness of the display, and control the light emitting elements of the optical sensor module based on the brightness of the display satisfying a designated condition such that the light emitting elements repetitively emit light as many a pre-defined number of times.

According to various example embodiments, the processor may be configured to: control the light emitting elements of the optical sensor module based on a duty cycle of the display within one frame based on the brightness of the display satisfying a designated condition such that the light emitting elements repetitively emit light as many as the pre-defined number of times.

According to various example embodiments, the processor may be configured to set the light-emitting points of time of the light emitting elements based on the off-time points of time of the display corresponding to the brightness of the display and at least some colors of the display.

Figure 6:
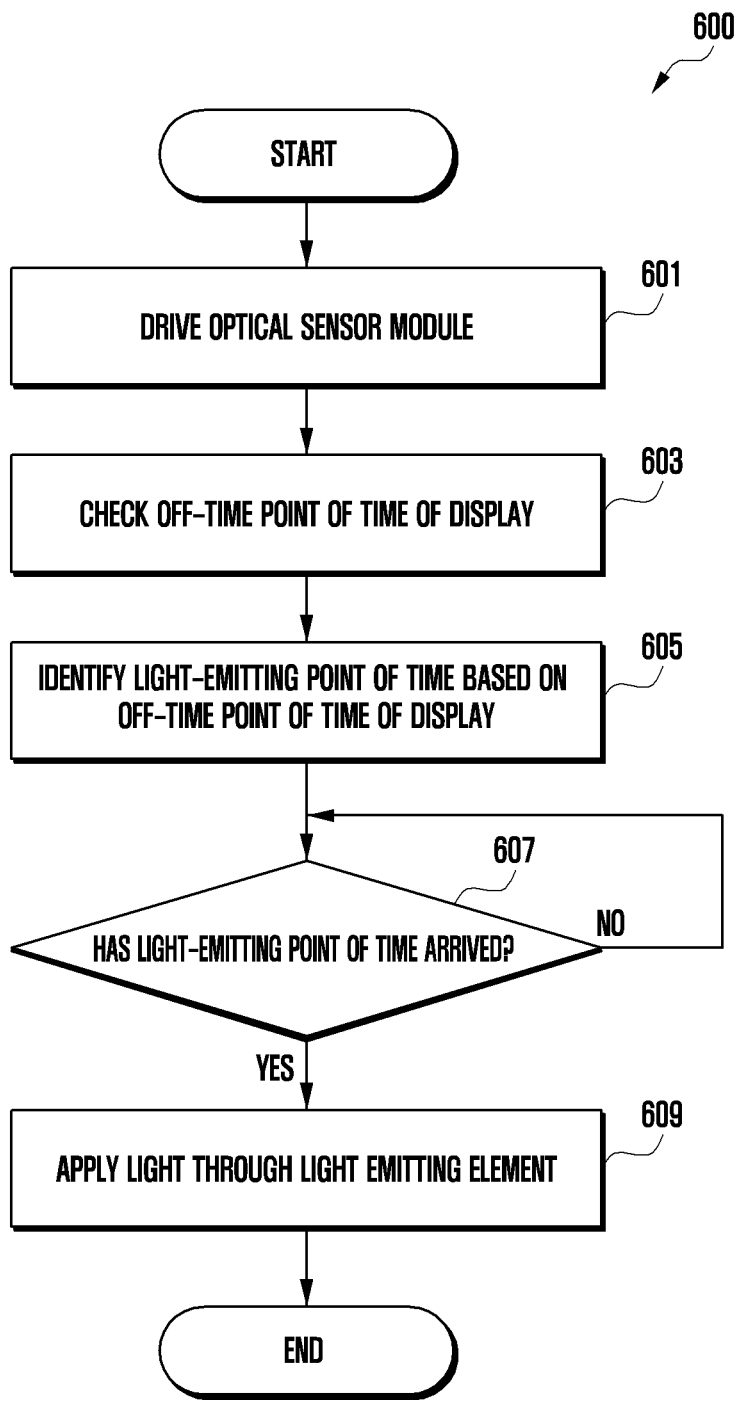
FIG. 6 is a flowchart illustrating an example operation of setting light-emitting points of time of an optical sensor module in an electronic device according to various embodiments.
Figure 7A:
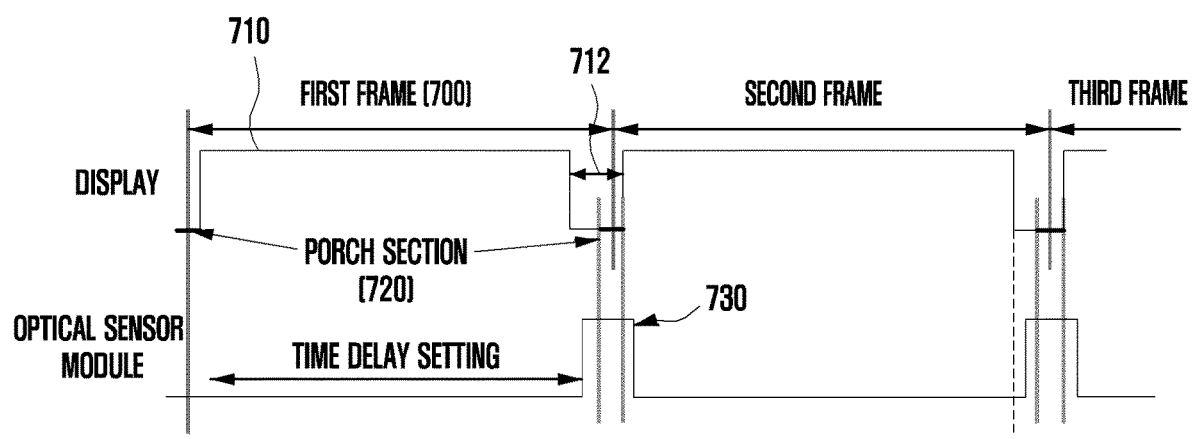
FIG. 7A is a diagram illustrating an example operation of an optical sensor module synchronized to a high-brightness display in an electronic device according to various embodiments.
Figure 7B:
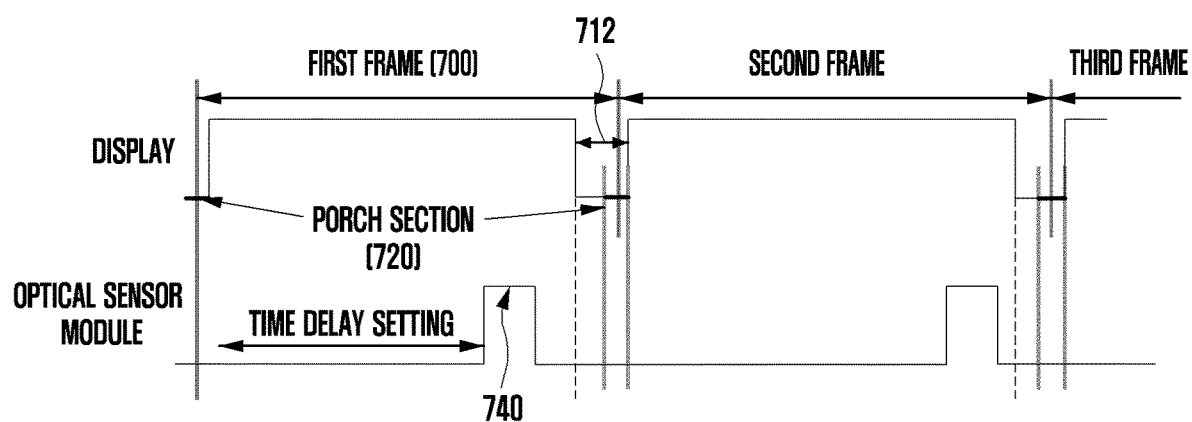
FIG. 7B is a diagram illustrating an example operation of an optical sensor module synchronized to a high-brightness display in an electronic device according to various embodiments.
Figure 8:
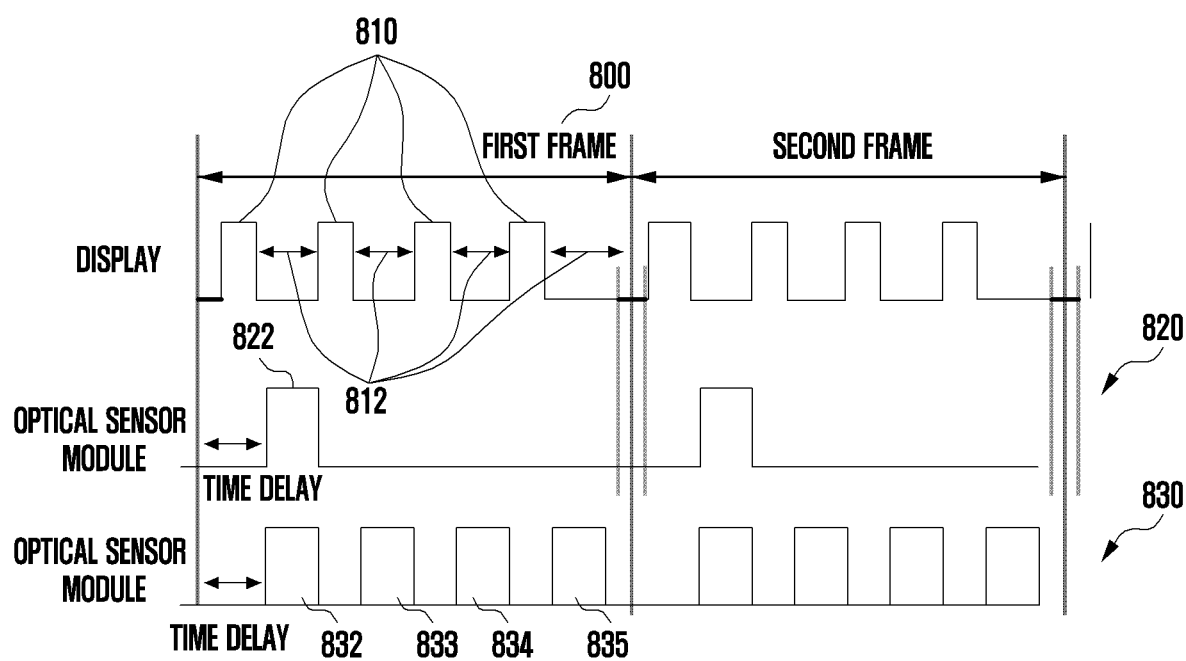
FIG. 8 is a diagram illustrating an example operation of an optical sensor module synchronized to a low-brightness display in an electronic device according to various embodiments.

FIG. 6 is a flowchart 600 illustrating an example operation of setting light-emitting points of time of an optical sensor module in an electronic device according to various embodiments. Processes in the following embodiments may be performed in order, but are not necessarily performed in order. For example, the order of the processes may be changed, and at least two processes may be performed in parallel. For example, an electronic device may be the electronic device 101 of FIG. 1, the electronic device 200 of FIGS. 2A and 2B, the electronic device 300 of FIG. 3A, 3B, 3C, or 3D, the electronic device 400 of FIG. 4, or the electronic device 500 of FIG. 5. In the following description, at least a partial portion of FIG. 6 will be described with reference to FIGS. 7A, 7B, and 8. FIGS. 7A and 7B are diagrams illustrating an example operation of an optical sensor module synchronized to a high-brightness display in an electronic device according to various embodiments. FIG. 8 is a diagram illustrating an example operation of an optical sensor module synchronized to a low-brightness display in an electronic device according to various embodiments.

Referring to FIG. 6, according to various embodiments, the electronic device (e.g., the processor 120 of FIG. 1 or the processor 510 or the optical sensor module 530 of FIG. 5) may drive an optical sensor module (e.g., the optical sensor module 530) in operation 601. According to an embodiment, the optical sensor module 530 may be driven based on a type of an application (e.g., a communication application) driven in the electronic device 500 or a selected input of a user.

According to various embodiments, the electronic device (e.g., the processor 120 or 510 or the optical sensor module 530) may check an off-time section corresponding to brightness of a display (e.g., the display 520) in operation 603. According to an embodiment, the processor 510 (or the optical sensor module 530) may check the off-time section corresponding to the brightness of the display 520 as set forth, for example, in Table 1.

TABLE 1

| Step | Brightness step | Maximum brightness | Wake-up illuminance | Display off time |
|---|---|---|---|---|
| 1 | 1 to 54 | 17 cd | 5 lux | 3.39 ms |
| 2 | 55 to 84 | 47 cd | 18 lux | 2 ms |
| 3 | 85 to 128 | 183 cd | 1000 lux | 1.49 ms |
| 4 | 129 to 142 | 207 cd | 1000 lux | 1.1 ms |
| 5 | 143 to 227 | 365 cd | 2000 lux | 454 µs |

For example, in the case of a relatively high brightness section, as illustrated in FIG. 7A or 7B, the display 520 may be operated in one duty cycle 710 for one frame 700. In this case, the processor 510 (or the optical sensor module 530) may check a porch section 720 in which the display 520 is deactivated. As another example, in the case of a relatively low brightness section, as in FIG. 8, the display 520 may be operated in a plurality of duty cycles 810 (e.g., four duty cycles) for one frame 800. In this case, the processor 510 (or the optical sensor module 530) may check off-time sections 812 according to the brightness of the display 520.

According to various embodiments, the electronic device (e.g., the processor 120 or 510 or the optical sensor module 530) may identify a light-emitting point of time (or a light-emitting section) of the optical sensor module (e.g., the optical sensor module 530) based on an off-time section of the display (e.g., the display 520) in operation 605. According to an embodiment, the light-emitting point of time (or the light-emitting section) of the optical sensor module 530 may be set to be included in a section in which the display 520 is deactivated based on the brightness of the display 520. For example, as in FIG. 7A or 7B, a light-emitting point of time (or a light-emitting section) 730 or 740 of the optical sensor module 530 may be set based on the porch section 720 in which the display 520 is deactivated. As another example, as in FIG. 8, a light-emitting point of time (or a light-emitting section) 832, 833, 834, or 835 of the optical sensor module 530 may be set based on the section 812 in which the display 520 is deactivated within one frame according to the brightness of the display 520. According to an embodiment, the light-emitting point of time (or the light-emitting section) of the optical sensor module 530 may be set based on a point of time at which the display 520 is deactivated and a color of content displayed on the display 520 according to the brightness of the display 520. For example, in the case where the color of content displayed on the display 520 in a state in which the brightness of the display 520 is relatively high is a black color, the light-emitting point of time (or the light-emitting section) 730 of the optical sensor module 530 may be set to be included in a section 712 in which the display 520 is deactivated based on the porch section 720 as in FIG. 7A. As an example, in the case where the color of content displayed on the display 520 in the state in which the brightness of the display 520 is relatively high is a white color, the light-emitting point of time (or the light-emitting section) 740 of the optical sensor module 530 may be set at a point of time ahead of the porch section 720 as in FIG. 7B.

According to various embodiments, the electronic device (e.g., the processor 120 or 510 or the optical sensor module 530) may check whether the light-emitting point of time (or the light-emitting section) of the optical sensor module (e.g., the optical sensor module 530) arrives in operation 607.

According to various embodiments, if the light-emitting point of time (or the light-emitting section) does not arrive (e.g., "NO" in operation 607), the electronic device (e.g., the processor 120 or 510 or the optical sensor module 530) may delay light emission of the light emitting elements until the light-emitting point of time (or the light-emitting section) arrives.

According to various embodiments, if the light-emitting point of time (or the light-emitting section) arrives (e.g., "YES" in operation 607), the electronic device (e.g., the processor 120 or 510 or the optical sensor module 530) may apply light to the outside of the electronic device (e.g., the electronic device 500) through the light emitting elements of the optical sensor module (e.g., the optical sensor module 530) in operation 609. According to an embodiment, if the light-emitting point of time (or the light-emitting section) 730 or 740 set based on the porch section 720 as in FIG. 7A or 7B arrives, the optical sensor module 530 may apply light to the outside through the light emitting elements. According to an embodiment, if the light-emitting point of time (or the light-emitting section) 822 set based on the off-time section 812 of the display 520 which corresponds to the brightness of the display 520 as in FIG. 8 arrives, the optical sensor module 530 may apply light to the outside of the electronic device 500 through the light emitting elements. As an example, the display 520 may apply light to the outside of the electronic device 500 through the light emitting elements for the light-emitting sections 832, 833, 834, and 835 that are set in all off-time sections 812 within one frame 800 in order to improve sensitivity of the optical sensor module 530.

According to various embodiments, the electronic device (e.g., the processor 120 or 510 or the optical sensor module 530) may check an amount of light (or intensity of light) applied through the light emitting elements that is reflected from the external object of the electronic device (e.g., the electronic device 500) and is collected through the light receiving module (e.g., the light receiving module 330 of FIG. 3A or 3B). The electronic device (e.g., the processor 120 or 510 or the optical sensor module 530) may check, based on the amount of light (or the intensity of light) collected through the light receiving module 330, whether the external object approaches the electronic device 500 or a distance from the external object.

According to various embodiments, the electronic device (e.g., the processor 120 or 510) may change a scanning rate of the display (e.g., the display 520) to control a length of the off-time section (e.g., the porch section) of the display. Thus, the electronic device (e.g., the processor 120 or 510) may change the scanning rate of the display (e.g., the display 520) to control a light-emitting time (or an on time) of the optical sensor module (e.g., the optical sensor module 530). According to an embodiment, as the scanning rate of the display 520 becomes relatively low, a length of the off-time section (e.g., the porch section) of the display 520 may be set to be relatively long. Thus, to set the light-emitting time of the optical sensor module 530 to be relatively long, the processor 510 may change a scanning rate of at least a partial region of the display 520 to be relatively low.

Figure 9:
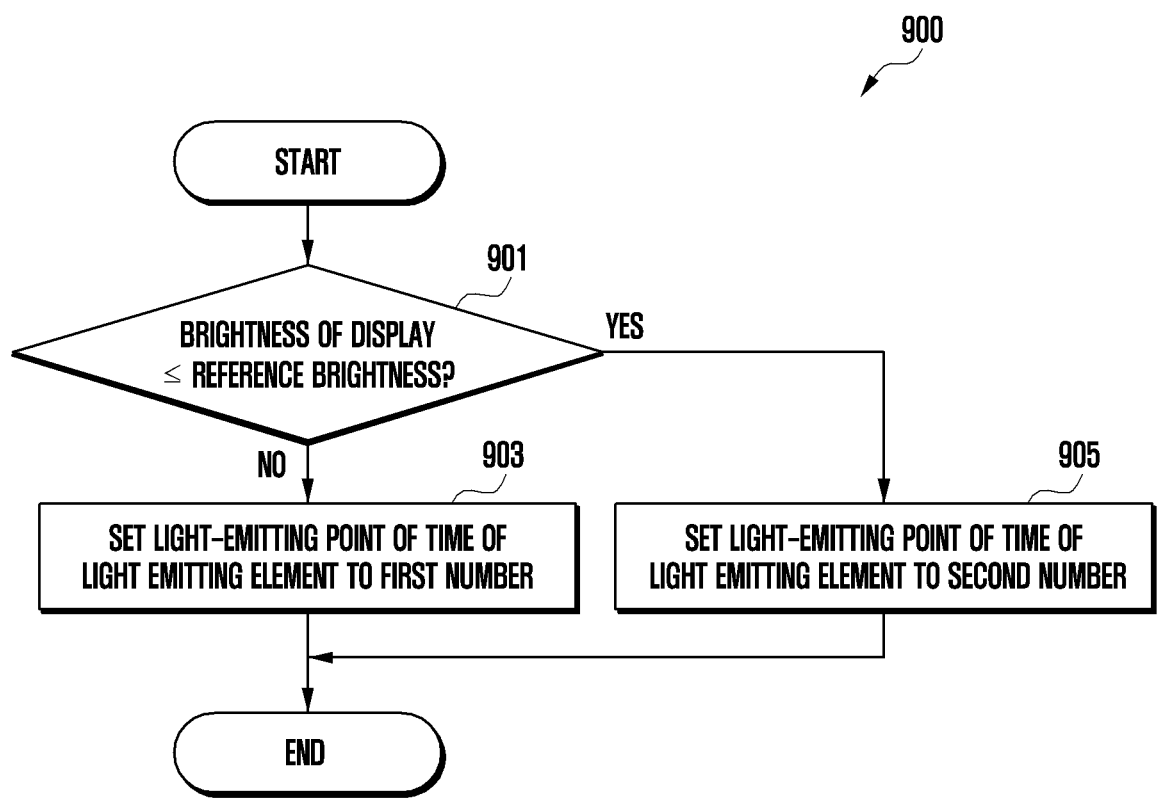
FIG. 9 is a flowchart illustrating an example operation of setting light-emitting points of time of an optical sensor module based on brightness of a display in an electronic device according to various embodiments.

FIG. 9 is a flowchart 900 illustrating an example operation of setting light-emitting points of time of an optical sensor module based on brightness of a display in an electronic device according to various embodiments. Processes of FIG. 9 to be described below may include detailed processes in operation 605 of FIG. 6. In the following example embodiments, the processes may be performed in order, but are not necessarily performed in order. For example, the order of the processes may be changed, and at least two processes may be performed in parallel. For example, an electronic device may be the electronic device 101 of FIG. 1, the electronic device 200 of FIGS. 2A and 2B, the electronic device 300 of FIG. 3A, 3B, 3C, or 3D, the electronic device 400 of FIG. 4, or the electronic device 500 of FIG. 5.

Referring to FIG. 9, according to various embodiments, the electronic device (e.g., the processor 120 of FIG. 1 or the processor 510 or the optical sensor module 530 of FIG. 5) may check whether brightness used to display information on a display (e.g., the display 520) is lower than or equal to reference brightness in operation 901. As an example, the reference brightness may include a brightness value that becomes a reference in order to distinguish the number of duty cycles that are operated for one frame based on brightness of the display 520.

According to various embodiments, if the brightness used to display the information on the display (e.g., the display 520) exceeds the reference brightness (e.g., "NO" in operation 901), the electronic device (e.g., the processor 120 or 510 or the optical sensor module 530) may set the number of light-emitting points of time (or light-emitting sections) of the light emitting elements within one frame to a first number (e.g., one) based on a duty cycle of the display (e.g., the display 520) which corresponds to the brightness of the display (e.g., the display 520) in operation 903. According to an embodiment, if the brightness of the display 520 exceeds the reference brightness, the display 520 may be operated in one duty cycle 710 for one frame 700 as in FIG. 7A or 7B. In this case, the processor 510 (or the optical sensor module 530) may determine that the optical sensor module 530 emits light once within one frame based on the duty cycle 710 of the display 520. The number of the light-emitting points of time of the optical sensor module 530 may be set to one. As an example, as in FIG. 7A or 7B, the light-emitting point of time (or the light-emitting section) 730 or 740 of the optical sensor module 530 may be set based on the porch section 720 of the display 520.

According to various embodiments, if the brightness used to display the information on the display (e.g., the display 520) is lower than or equal to the reference brightness (e.g., "YES" in operation 901), the electronic device (e.g., the processor 120 or 510 or the optical sensor module 530) may set the number of light-emitting points of time (or light-emitting sections) of the light emitting elements within one frame to a second number (e.g., a pre-defined number) based on the duty cycle of the display (e.g., the display 520) which corresponds to the brightness of the display (e.g., the display 520) in operation 905. According to an embodiment, if the brightness used to display the information on the display 520 is lower than or equal to the reference brightness, the processor 510 may determine that the brightness satisfies a designated condition. If the brightness of the display 520 satisfies the designated condition (e.g., lower than or equal to the reference brightness), the display 520 may be operated in a plurality of duty cycles 810 (e.g., four duty cycles) for one frame 800 as in FIG. 8. In this case, the processor 510 (or the optical sensor module 530) may determine, based on the duty cycles 810 of the display 520, that the optical sensor module 530 emits light a plurality of times (e.g., four times) within one frame. The number of light-emitting points of time of the optical sensor module 530 may be set to a multiple number (e.g., four). As an example, the number of light-emitting sections (e.g., light-emitting points of time and light-emitting periods) 832, 833, 834, and 835 of the optical sensor module 530 may be pre-defined based on the off-time section 812 of the display 520 as in FIG. 8.

Figure 10:
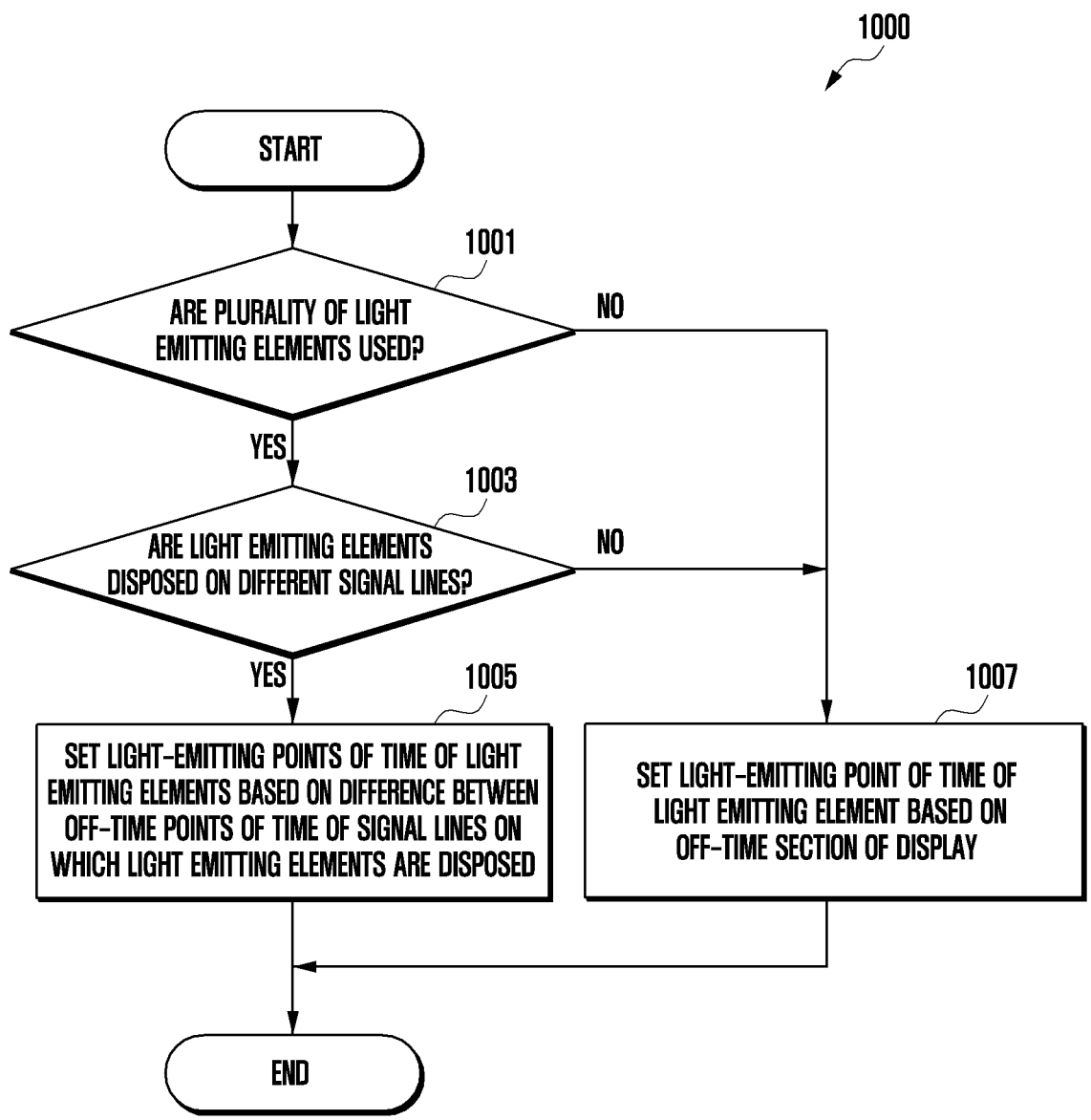
FIG. 10 is a flowchart illustrating an example operation of setting light-emitting points of time of a plurality of light emitting elements in an electronic device according to various embodiments.

FIG. 10 is a flowchart 1000 illustrating an example operation of light-emitting points of time of a plurality of light emitting elements in an electronic device according to various embodiments. Processes of FIG. 10 to be described below may be detailed processes in operation 605 of FIG. 6. In the following example embodiments, the operations may be performed in order, but are not necessarily performed in order. For example, the order of the processes may be changed, and at least two processes may be performed in parallel. For example, an electronic device may be the electronic device 101 of FIG. 1, the electronic device 200 of FIGS. 2A and 2B, the electronic device 300 of FIGS. 3A and 3B, the electronic device 400 of FIG. 4, or the electronic device 500 of FIG. 5.

Referring to FIG. 10, according to various embodiments, the electronic device (e.g., the processor 120 of FIG. 1 or the processor 510 or the optical sensor module 530 of FIG. 5) may check whether a plurality of light emitting elements included in the optical sensor module (e.g., the optical sensor module 530) are used in operation 1001. According to an embodiment, the processor 510 (or the optical sensor module 530) may determine whether the plurality of light emitting elements (e.g., the light emitting elements 341, 342, 343, and 344 of FIG. 3B) are used to improve sensitivity of the optical sensor module 530.

According to various embodiments, if it is determined that the plurality of light emitting elements are used (e.g., "YES" in operation 1001), the electronic device (e.g., the processor 120 or 510 or the optical sensor module 530) may check whether the plurality of light emitting elements are disposed on different signal lines in operation 1003. According to an embodiment, if the light emitting elements driven to emit light are the first light emitting element 341 and the third light emitting element 343 of FIG. 3B, the processor 510 (or the optical sensor module 530 may determine that the plurality of light emitting elements are disposed on the same signal line. According to an embodiment, if the light emitting elements driven to emit light are the first light emitting element 341 and the second light emitting element 342 of FIG. 3B, the processor 510 (or the optical sensor module 530) may determine that the plurality of light emitting elements are disposed on different signal lines.

According to various embodiments, if it is determined that one light emitting element is used (e.g., "NO" in operation 1001) or if the plurality of light emitting elements are disposed on the same signal line (e.g., "NO" in operation 1003), the electronic device (e.g., the processor 120 or 510 or the optical sensor module 530) may set light-emitting points of time (or light-emitting sections) of the light emitting elements based on an off-time section of the display (e.g., the display 520) (or the signal line) in operation 1007. According to an embodiment, if the second light emitting element 324 of FIG. 3A is used, the processor 510 (or the optical sensor module 530) may set the light-emitting point of time of the second light emitting element 324 based on the off-time section (or the off-time point of time of the second signal line) of the display 520. According to an embodiment, if the first light emitting element 341 and the third light emitting element 343 disposed on the first signal line in FIG. 3B are used, the processor 510 (or the optical sensor module 530) may set the light-emitting points of time of the first light emitting element 341 and the third light emitting element 343 based on the off-time section (or the off-time point of time of the first signal line) of the display 520.

According to various embodiments, if the plurality of light emitting elements are disposed on different signal lines (e.g., "YES" in operation 1003), the electronic device (e.g., the processor 120 or 510 or the optical sensor module 530) may set the light-emitting points of time (or the light-emitting sections) of the light emitting elements based on a difference between the off-time points of time (or the off-time sections) of the signal lines on which the light emitting elements are disposed in operation 1005. According to an embodiment, if the first light emitting element 322 and the second light emitting element 324 of FIG. 3A are used, the processor 510 (or the optical sensor module 530) may set the of the light-emitting point of time of the first light emitting element 322 based on the off-time point of time of the first signal line on which the first light emitting element 322 is disposed. The processor 510 (or the optical sensor module 530) may set the light-emitting point of time of the second light emitting element 324 at a delayed point of time which is further delayed than the emitting point of time of the first light emitting element 322 and corresponds to a difference between the off-time section of the first signal line and the off-time section of the second signal line on which the second light emitting element 324 is disposed.

Figure 11:
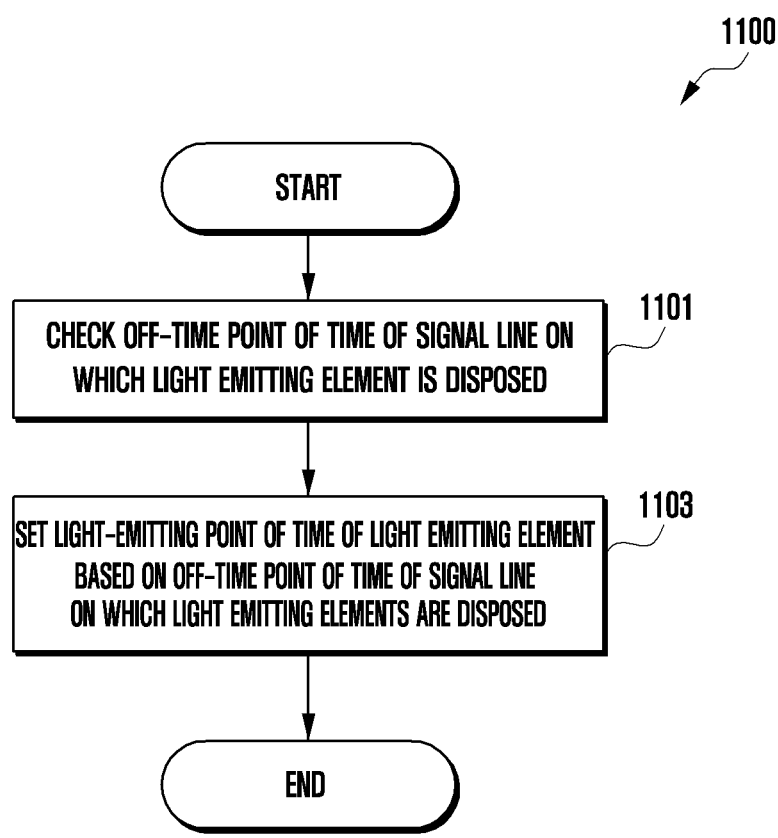
FIG. 11 is a flowchart illustrating an example operation of setting light-emitting points of time of light emitting elements in an electronic device according to various embodiments.
Figure 12:
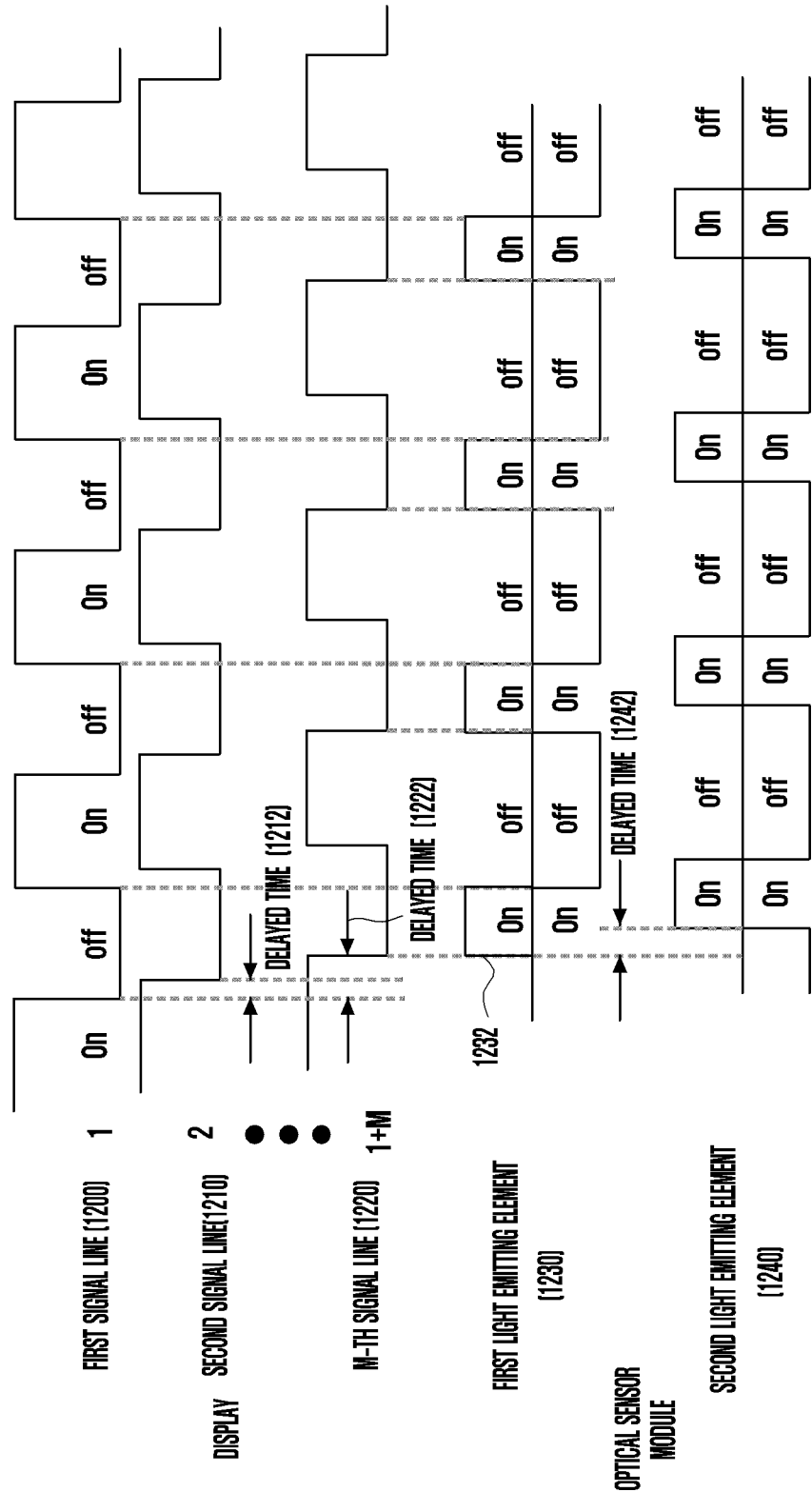
FIG. 12 is a diagram illustrating example operations of a plurality of light emitting elements synchronized to a display in an electronic device according to various embodiments.

FIG. 11 is a flowchart 1100 illustrating an example operation of setting light-emitting points of time of light emitting elements in an electronic device according to various embodiments. Processes of FIG. 11 to be described below may be detailed processes in operation 1005 of FIG. 10. In the following example embodiments, the processes may be performed in order, but are not necessarily performed in order. For example, the order of the processes may be changed, and at least two processes may be performed in parallel. For example, an electronic device may be the electronic device 101 of FIG. 1, the electronic device 200 of FIGS. 2A and 2B, the electronic device 300 of FIG. 3A, 3B, 3C, or 3D, the electronic device 400 of FIG. 4, or the electronic device 500 of FIG. 5. In the following description, at least a partial configuration of FIG. 11 will be described with reference to FIG. 12. FIG. 12 is a diagram illustrating operations of a plurality of light emitting elements synchronized to a display in an electronic device according to various embodiments.

Referring to FIG. 11, according to various embodiments, the electronic device (e.g., the processor 120 of FIG. 1 or the processor 510 or the optical sensor module 530 of FIG. 5) may check the off-time points of time of the signal lines on which the light emitting elements determined to be used in the optical sensor module are disposed in operation 1101. According to an embodiment, if a first light emitting element 1230 and a second light emitting element 1240 of FIG. 12 are used, the processor 510 (or the optical sensor module 530) may check off-time points of time of a first signal line 1200 on which the first light emitting element 1230 is disposed and an m-th signal line 1220 on which the second light emitting element 1240 is disposed. As an example, the off-time points of time of the first signal line 1200 and the m-th signal line 1220 may cause a difference corresponding to a delayed time 1222. As an example, the difference 1222 between the off-time points of time of the first signal line 1200 and the m-th signal line 1220 may be checked based on a delayed time 1212 between the neighboring signal lines (e.g., the first signal line 1200 and the second signal line 1210) and a number (e.g., an m number) of the signal lines disposed between the first signal line 1200 and the second signal line 1210.

According to various embodiments, the electronic device (e.g., the processor 120 or 510 or the optical sensor module 530) may set the light-emitting points of time of the light emitting elements based on the off-time points of time of the signal lines on which the light emitting elements are disposed in operation 1103. According to an embodiment, as in FIG. 12, the processor 510 (or the optical sensor module 530) may set a light-emitting point of time 1232 of the first light emitting element 1230 based on the basis of the off-time point of time of the first signal line 1200. The processor 510 (or the optical sensor module 530) may set the light-emitting point of time of the second light emitting element 1240 at a point of time 1242 which is further delayed than the light-emitting point of time 1232 of the first light emitting element 1230 by the time 1222 between off-time sections of the first signal line 1200 and the m-th signal line 1220.

According to various example embodiments, a method of operating an electronic device (e.g., the electronic device 101 of FIG. 1, the electronic device 200 of FIGS. 2A and 2B, the electronic device 300 of FIG. 3A, 3B, 3C, or 3D, the electronic device 400 of FIG. 4, or the electronic device 500 of FIG. 5) may include: emitting light from a first light emitting element (e.g., the first light emitting element 322 or 341 of FIG. 3A or 3B) of an optical sensor module (e.g., the optical sensor module 530 of FIG. 5) disposed to overlap a first signal line of a plurality of signal lines included in a display (e.g., the display 520 of FIG. 5) of the electronic device at a first light-emitting point of time based on an off-time point of time of the first signal line corresponding to brightness of the display (e.g., the display 520 of FIG. 5), and emitting light from a second light emitting element (e.g., the second light emitting element 324 or 342 of FIG. 3A or 3B) of the optical sensor module disposed to overlap a second signal line different from the first signal line of the plurality of signal lines at a second light-emitting point of time different from the first light-emitting point of time based on a time difference between the off-time point of time of the first signal line and an off-time point of time of the second signal line.

According to various example embodiments, the method of operating the electronic device may further include: emitting light from a third light emitting element (e.g., the third light emitting element 343 of FIG. 3B) of the optical sensor module disposed to overlap the first signal line of the display at the first light-emitting point of time, and emitting light from a fourth light emitting element (e.g., the fourth light emitting element 344 of FIG. 3B) of the optical sensor module disposed to overlap the second signal line of the display at the second light-emitting point of time.

According to various example embodiments, the time difference between the off-time points of time of the first signal line and the second signal line may be checked on the number of third signal lines disposed between the first signal line and the second signal line.

According to various example embodiments, the first light-emitting point of time may be set based on the off-time point of time of the first signal line corresponding to the brightness of the display and at least some colors of the display in which the first signal line is included.

According to various example embodiments, the optical sensor module may include at least one of a camera, an ultraviolet (UV) sensor, an iris sensor, a spectral sensor, an infrared sensor, an RGB sensor, or a time-of-flight (TOF) sensor.

According to various example embodiments, the electronic device sets the light-emitting points of time of the optical sensor module disposed on the rear surface of the display based on the off-time section corresponding to the brightness of the display and/or the color of the display, and thereby can improve a distortion phenomenon of the display caused by the optical sensor module disposed on the rear surface of the display.

According to various example embodiments, if low-brightness information is displayed on the display, the electronic device controls the optical sensor module disposed on the rear surface of the display such that light is repetitively emitted a plurality of times based on the off-time section of the display, and thereby can improve sensitivity of the optical sensor module.

According to various example embodiments, if the optical sensor module disposed on the rear surface of the display includes a plurality of light emitting elements disposed on different signal lines of the display, the electronic device differently sets the light-emitting points of time of the light emitting elements disposed on the different signal lines based on a difference between the off-time points of time corresponding to the brightness of the signal lines, and thereby can improve the distortion phenomenon of the display caused by the optical sensor module disposed on the rear surface of the display.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
 a housing;
 a display disposed in an internal space of the housing to be at least partly visible from outside through the housing, and including a plurality of signal lines;
 an optical sensor module disposed in the internal space below the display and overlapping the display, the optical sensor module including:
  a first light emitting element overlapping a first signal line of the display,
  a second light emitting element overlapping a second signal line of the display different from the first signal line of the display, and
  a light receiving element configured to collect light from the first light emitting element and/or the second light emitting element that is reflected and received from an external object; and
 a processor operatively connected to the display and the optical sensor module,
 wherein the processor is configured to: control the first light emitting element based on an off-time point of time of the first signal line corresponding to brightness of the display such that the first light emitting element emits light at a first light-emitting point of time, and control the second light emitting element based on a time difference between the off-time point of time of the first signal line and an off-time point of time of the second signal line such that the second light emitting element emits light at a second light-emitting point of time different from the first light-emitting point of time.

2. The electronic device of claim 1, wherein the optical sensor module further comprises a third light emitting element overlapping the first signal line of the display, and a fourth light emitting element overlapping the second signal line of the display.

3. The electronic device of claim 2, wherein:
the first light emitting element and the third light emitting element, and the second light emitting element and the fourth light emitting element are disposed apart from each other by a first reference distance; and
the first light emitting element and the second light emitting element, and the third light emitting element and the fourth light emitting element are disposed apart from each other by a second reference distance.

4. The electronic device of claim 3, wherein the processor is configured to check the time difference between the off-time points of time of the first signal line and the second signal line based on the second reference distance.

5. The electronic device of claim 2, wherein the processor is configured to:
control the first light emitting element and the third light emitting element overlapping the first signal line such that the first light emitting element and the third light emitting element emit light at the first light-emitting point of time, and
control the second light emitting element and the fourth light emitting element overlapping the second signal line such that the second light emitting element and the fourth light emitting element emit light at the second light-emitting point of time.

6. The electronic device of claim 1, wherein the processor is configured to check the time difference between the off-time points of time of the first signal line and the second signal line based on a number of third signal lines disposed between the first signal line and the second signal line.

7. The electronic device of claim 1, wherein the processor is configured to set the first light-emitting point of time at which the first light emitting element emits light based on the off-time point of time of the first signal line corresponding to the brightness of the display and at least some colors of the display in which the first signal line is included.

8. The electronic device of claim 1, wherein the optical sensor module includes at least one of a camera, an ultraviolet (UV) sensor, an iris sensor, a spectral sensor, an infrared sensor, an RGB sensor, or a time-of-flight (TOF) sensor.

9. An electronic device comprising:
a housing;
a display disposed in an internal space of the housing to be at least partly visible from outside through the housing, and including a plurality of signal lines; and
an optical sensor module disposed in the internal space below the display, overlapping the display and operatively connected to the display, the optical sensor module including:
a first light emitting element overlapping a first signal line of the display,
a second light emitting element overlapping a second signal line different from the first signal line of the display, and
a light receiving element including light receiving circuitry configured to collect light from the first light emitting element and/or the second light emitting element that is reflected and received from an external object,
wherein the first light emitting element is configured to emit light at a first light-emitting point of time based on an off-time point of time of the first signal line corresponding to brightness of the display, and
the second light emitting element is configured to emit light at a second light-emitting point of time different from the first light-emitting point of time based on a time difference between the off-time point of time of the first signal line and an off-time point of time of the second signal line.

10. The electronic device of claim 9, wherein the optical sensor module is configured to check the first light-emitting point of time of the first light emitting element based on information related to the off-time point of time corresponding to brightness of the display provided from the display.

11. The electronic device of claim 9, wherein:
the optical sensor module further comprises a third light emitting element overlapping the first signal line of the display, and a fourth light emitting element overlapping the second signal line of the display;
the third light emitting element is configured to emit light at the first light-emitting point of time; and
the fourth light emitting element is configured to emit light at the second light-emitting point of time.

12. The electronic device of claim 11, wherein:
the first light emitting element and the third light emitting element, and the second light emitting element and the fourth light emitting element are disposed apart from each other by a first reference distance, and
the first light emitting element and the second light emitting element, and the third light emitting element and the fourth light emitting element are disposed apart from each other by a second reference distance.

13. A method of operating an electronic device comprising:
emitting light from a first light emitting element of an optical sensor module overlapping a first signal line of a plurality of signal lines included in a display of the electronic device at a first light-emitting point of time based on an off-time point of time of the first signal line corresponding to brightness of the display; and
emitting light from a second light emitting element of the optical sensor module overlapping a second signal line different from the first signal line of the plurality of signal lines, at a second light-emitting point of time different from the first light-emitting point of time based on a time difference between the off-time point of time of the first signal line and an off-time point of time of the second signal line.

14. The method of claim 13, further comprising:
emitting light from a third light emitting element of the optical sensor module overlapping the first signal line of the display, at the first light-emitting point of time; and
emitting light from a fourth light emitting element of the optical sensor module overlapping the second signal line of the display, at the second light-emitting point of time.

15. The method of claim 13, wherein the time difference between the off-time points of time of the first signal line and the second signal line are checked based on a number of third signal lines disposed between the first signal line and the second signal line.

16. The method of claim 13, wherein the first light-emitting point of time is set based on the off-time point of time of the first signal line corresponding to the brightness of the display and at least some colors of the display in which the first signal line is included.

17. The method of claim 13, wherein the optical sensor module includes at least one of a camera, an ultraviolet (UV) sensor, an iris sensor, a spectral sensor, an infrared sensor, an RGB sensor, or a time-of-flight (TOF) sensor.

18. An electronic device comprising:
a housing;
a display disposed in an internal space of the housing to be at least partly visible from outside through the housing;
an optical sensor module comprising at least one optical sensor disposed in the internal space below the display and overlapping the display; and
a processor operatively connected to the display and the optical sensor module,
wherein the processor is configured to:
control light emitting elements of the optical sensor module such that the light emitting elements emit light at light-emitting points of time based on off-time points of time of the display corresponding to brightness of the display, and
control the light emitting elements of the optical sensor module based on the brightness of the display satisfying a designated condition such that the light emitting elements repetitively emit light a pre-defined number of times.

19. The electronic device of claim 18, wherein the processor is configured to control the light emitting elements of the optical sensor module based on a duty cycle of the display within one frame based on the brightness of the display satisfying a designated condition such that the light emitting elements repetitively emit light the pre-defined number of times.

20. The electronic device of claim 18, wherein the processor is configured to set the light-emitting points of time of the light emitting elements based on off-time points of time of the display corresponding to the brightness of the display and at least some colors of the display.

\* \* \* \* \*